United States Patent
Lee et al.

(10) Patent No.: US 8,438,451 B2
(45) Date of Patent: May 7, 2013

(54) DTV TRANSMITTING SYSTEM AND RECEIVING SYSTEM AND METHOD OF PROCESSING BROADCAST SIGNAL

(75) Inventors: Hyoung Gon Lee, Seoul (KR); In Hwan Choi, Gwacheon-si (KR); Kook Yeon Kwak, Anyang-si (KR)

(73) Assignee: LG Electronics Inc., Seoul (KR)

( * ) Notice: Subject to any disclaimer, the term of this patent is extended or adjusted under 35 U.S.C. 154(b) by 244 days.

(21) Appl. No.: 12/904,987

(22) Filed: Oct. 14, 2010

(65) Prior Publication Data

US 2011/0072329 A1 Mar. 24, 2011

Related U.S. Application Data

(63) Continuation of application No. 11/680,438, filed on Feb. 28, 2007, now Pat. No. 7,840, 882.

(60) Provisional application No. 60/883,305, filed on Jan. 3, 2007.

(30) Foreign Application Priority Data

Feb. 28, 2006 (KR) .................. 10-2006-0019649
Sep. 15, 2006 (KR) .................. 10-2006-0089736

(51) Int. Cl.
*H03M 13/00* (2006.01)

(52) U.S. Cl.
USPC ................. 714/758; 714/755; 714/784

(58) Field of Classification Search .......... 714/758, 714/754, 755, 752, 784, 786, 792; 375/261, 375/265
See application file for complete search history.

(56) References Cited

U.S. PATENT DOCUMENTS

| 4,642,755 | A | | 2/1987 | Hinch |
| 5,164,963 | A | * | 11/1992 | Lawrence et al. ............. 375/265 |
| 5,177,796 | A | | 1/1993 | Feig et al. |
| 5,314,547 | A | * | 5/1994 | Heremans et al. ........... 148/33.1 |
| 5,544,328 | A | * | 8/1996 | Seshadri ...................... 375/261 |
| 6,269,125 | B1 | * | 7/2001 | Seccia et al. .................. 375/265 |
| 6,650,880 | B1 | | 11/2003 | Lee et al. |
| 6,687,310 | B1 | | 2/2004 | Fimoff et al. |
| 6,944,242 | B2 | | 9/2005 | Yakhnich et al. |
| 7,111,221 | B2 | | 9/2006 | Birru et al. |

(Continued)

FOREIGN PATENT DOCUMENTS

KR 1020040083248 10/2004
KR 1020050049923 5/2005

(Continued)

*Primary Examiner* — Fritz Alphonse
(74) *Attorney, Agent, or Firm* — Lee, Hong, Degerman, Kang & Waimey

(57) ABSTRACT

A DTV transmitting system includes a first pre-processor for coding first enhanced data having a high priority for forward error correction (FEC) at a first coding rate and expanding the first enhanced data at a first expansion rate, and a second pre-processor for coding second enhanced data having a low priority for FEC at a second coding rate and expanding the second enhanced data at a second expansion rate. The receiving system further includes a data formatter for generating enhanced data packets, a multiplexer for multiplexing the enhanced data packets with main data packets, an RS encoder for RS-coding the multiplexed data packets, and a data interleaver for interleaving the RS-coded data packets and outputting a group of interleaved data packets having a head, a body, and a tail.

6 Claims, 9 Drawing Sheets

U.S. PATENT DOCUMENTS

| | | |
|---|---|---|
| 7,170,849 B1 | 1/2007 | Arivoli et al. |
| 2002/0154709 A1 | 10/2002 | Choi et al. |
| 2002/0194570 A1 | 12/2002 | Birru et al. |
| 2003/0099303 A1 | 5/2003 | Birru et al. |
| 2004/0090997 A1 | 5/2004 | Choi et al. |
| 2007/0201516 A1 | 8/2007 | Lee et al. |

FOREIGN PATENT DOCUMENTS

| | | |
|---|---|---|
| KR | 1020050097438 | 10/2005 |
| KR | 1020050111869 | 11/2005 |
| WO | 2005/006759 | 1/2005 |
| WO | 2005/115001 | 12/2005 |
| WO | 2005/120062 | 12/2005 |

* cited by examiner

DTV TRANSMITTING SYSTEM AND RECEIVING SYSTEM AND METHOD OF PROCESSING BROADCAST SIGNAL

CROSS REFERENCE TO RELATED APPLICATIONS

This application is a continuation of U.S. application Ser. No. 11/680,438, filed on Feb. 28, 2007, now U.S. Pat. No. 7,840,882, which claims the benefit of U.S. Provisional Application No. 60/883,305, filed on Jan. 3, 2007, and claims benefit of earlier filing date and right to priority to Korean Patent Application No. 10-2006-0019649, filed on Feb. 28, 2006, and Korean Patent Application No. 10-2006-0089736, filed on Sep. 15, 2006, which are all hereby incorporated by reference herein in their entirety.

BACKGROUND OF THE INVENTION

1. Field of the Invention

The present invention relates to a digital telecommunications system, and more particularly, to a DTV transmitting system and receiving system and method of processing broadcast signal that can receive and transmit digital broadcast signal.

2. Discussion of the Related Art

Presently, the technology for processing digital signals is being developed at a vast rate, and, as a larger number of the population uses the Internet, digital electric appliances, computers, and the Internet are being integrated. Therefore, in order to meet with the various requirements of the users, a system that can transmit diverse supplemental information in addition to video/audio data through a digital television channel needs to be developed.

Some users may assume that supplemental data broadcasting would be applied by using a PC card or a portable device having a simple in-door antenna attached thereto. However, when used indoors, the intensity of the signals may decrease due to a blockage caused by the walls or disturbance caused by approaching or proximate mobile objects. Accordingly, the quality of the received digital signals may be deteriorated due to a ghost effect and noise caused by reflected waves. However, unlike the general video/audio data, when transmitting the supplemental data, the data that is to be transmitted should have a low error ratio. More specifically, in case of the video/audio data, errors that are not perceived or acknowledged through the eyes or ears of the user can be ignored, since they do not cause any or much trouble. Conversely, in case of the supplemental data (e.g., program execution file, stock information, etc.), an error even in a single bit may cause a serious problem. Therefore, a system highly resistant to ghost effects and noise is required to be developed.

The supplemental data are generally transmitted by a time-division method through the same channel as the video/audio data. However, with the advent of digital broadcasting, digital television receiving systems that receive only video/audio data are already supplied to the market. Therefore, the supplemental data that are transmitted through the same channel as the video/audio data should not influence the conventional receiving systems that are provided in the market. In other words, this may be defined as the compatibility of broadcast system, and the supplemental data broadcast system should be compatible with the broadcast system. Herein, the supplemental data may also be referred to as enhanced data. Furthermore, in a poor channel environment, the receiving performance of the conventional receiving system may be deteriorated. More specifically, resistance to changes in channels and noise is more highly required when using portable and/or mobile receiving systems.

SUMMARY OF THE INVENTION

Accordingly, the present invention is directed to a DTV transmitting system and a DTV receiving system and a method of processing broadcast signal that substantially obviates one or more problems due to limitations and disadvantages of the related art.

An object of the present invention is to provide a DTV transmitting system and a DTV receiving system and a method of processing broadcast signal that is suitable for transmitting supplemental data and that is highly resistant to noise.

Another object of the present invention is to provide a DTV transmitting system and a DTV receiving system and a method of processing broadcast signal that can perform additional encoding and create hierarchical areas in accordance with the importance of the enhanced data, thereby enhancing the receiving performance of the receiving system.

A further object of the present invention is to provide a DTV transmitting system and a DTV receiving system and a method of processing broadcast signal that can divide the known data, which are known by the transmitting and receiving systems, and the enhanced data into hierarchical areas and that can multiplexed the divided data with the main data, thereby enhancing the receiving performance of the receiving system.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a digital television (DTV) transmitting system for processing main and enhanced data for transmission includes a first pre-processor, a second pre-processor, a data formatter, a multiplexer, an Reed-Solomon (RS) encoder, and a data interleaver. The first pre-processor pre-processes first enhanced data having a high priority by coding the first enhanced data for forward error correction (FEC) at a first coding rate and expanding the FEC-coded first enhanced data at a first expansion rate. The second pre-processor pre-processes second enhanced data having a low priority by coding the second enhanced data for forward error correction (FEC) at a second coding rate and expanding the FEC-coded second enhanced data at a second expansion rate. The data formatter generates enhanced data packets including the pre-processed first and second enhanced data. The multiplexer then multiplexes the enhanced data packets with main data packets including the main data. The RS encoder codes the multiplexed main and enhanced data packets by adding systematic parity data to each main data packet and adding RS parity place holders to each enhanced data packet. The data interleaver interleaves the RS-coded main and enhanced data packets and outputs a group of interleaved data packets having a head, a body, and a tail.

In another aspect of the present invention, a digital television (DTV) receiving system for processing a digital broadcast signal includes a tuner, a demodulator, and four decoders. The tuner tunes to a channel in order to receive a digital television signal from a broadcast transmitting system. The demodulator demodulates the digital broadcast signal. The first decoder decodes main data, first enhanced data having a high priority, and second enhanced data having a lower priority included in the demodulated signal. The first decoder calculates soft decision values for the first and second enhanced data and hard decision values for the main data. The second decoder decodes the decoded main data and the first and second enhanced data for forward error correction (FEC). The third decoder further decodes the FEC-decoded first enhanced data at a first decoding rate for additional forward error correction, and the fourth decoder further decodes the FEC-decoded second enhanced data at a second decoding rate for additional forward error correction. The DTV receiving system may further include a first data remover for removing first null data included in the FEC-decoded first enhanced data outputted from the second decoder, and a second data remover for removing second null data included in the FEC-decoded second enhanced data outputted from the second encoder.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention.
In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts. In addition, although the terms used in the present invention are selected from generally known and used terms, some of the terms mentioned in the description of the present invention have been selected by the applicant at his or her discretion, the detailed meanings of which are described in relevant parts of the description herein. Furthermore, it is required that the present invention is understood, not simply by the actual terms used but by the meaning of each term lying within.

In the present invention, the enhanced data may either consist of data including information such as program execution files, stock information, and so on, or consist of video/audio data. Additionally, the known data refer to data already known based upon a pre-determined agreement between the transmitting system and the receiving system. Furthermore, the main data consist of data that can be received from the conventional receiving system, wherein the main data include video/audio data. The present invention relates to identifying the enhanced data having information included therein and to performing individual or integrated additional coding processes on the identified enhanced data. The enhanced data may be identified based upon a plurality of criteria. For example, in the present invention, the enhanced data may be identified based on the priority (high or low) of the data.

Furthermore, the present invention relates to grouping a plurality of enhanced data packets, and to multiplexing the grouped data packets with the main data and then transmitting the multiplexed data. Herein, the enhanced data group is divided into a plurality of hierarchical layers (or areas). The present invention, therefore, relates to identifying the enhanced data type and also the method for processing the corresponding data in accordance with the characteristics of the hierarchical areas. In the present invention, the enhanced data may be identified by N number of enhanced data types starting from high priority enhanced data and low priority enhanced data. For simplicity, in the example shown in the present invention, the enhanced data are identified as 2 different types: high priority enhanced data and low priority enhanced data. However, this is merely exemplary, and the examples shown in the description of the present invention do not limit the scope of the invention.

Figure 1:
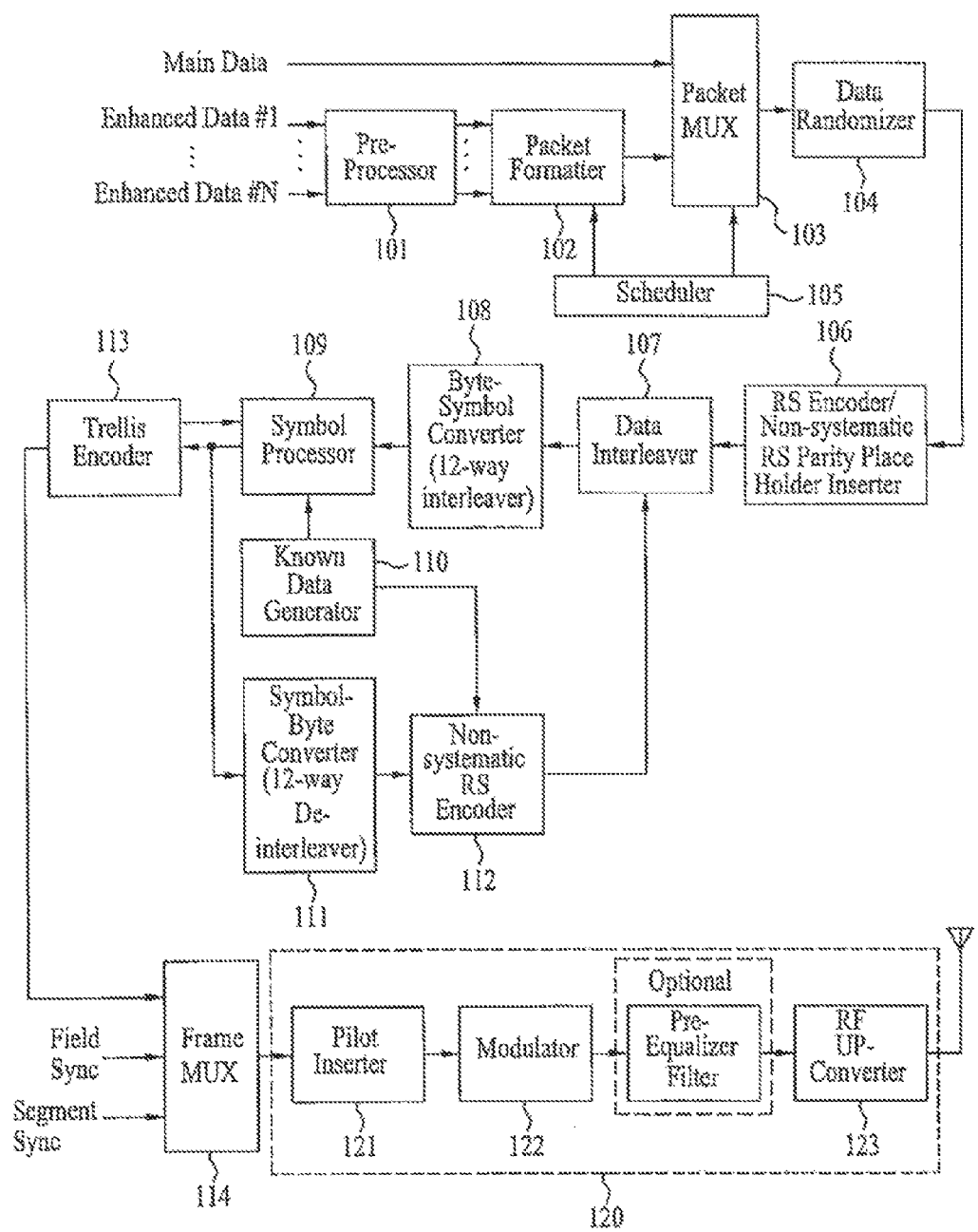
FIG. 1 illustrates a block diagram showing the structure of a digital broadcast transmitting system according to an embodiment of the present invention.

FIG. 1 illustrates a block diagram of a digital broadcast (or television) transmitting system according to the present invention, wherein the enhanced data are received so as to be processed with additional encoding individually or in integrated groups, which are then multiplexed with known data and main data and transmitted. Referring to FIG. 1, the digital broadcast transmitting system (or digital television transmitter) includes an pre-processor 101, an packet formatter 102, a packet multiplexer 103, a data randomizer 104, a scheduler 105, a Reed-Solomon (RS) encoder/non-systematic Reed-Solomon (RS) parity place holder inserter 106, a data interleaver 107, a byte-symbol converter 108, an symbol processor 109, a known data generator 110, a symbol-byte converter 111, a non-systematic RS encoder 112, a trellis encoder 113, a frame multiplexer 114, and a transmitting unit 120. Herein, the pre-processor 101 receives and pre-processes the enhanced data by performing pre-processes, such as additional block encoding, block interleaving, and byte-expansion by inserting null data, and then outputs the pre-processed enhanced data to the packet formatter 102.

At this point, when the inputted enhanced data correspond to the above-described high priority enhanced data and the low priority enhanced data, the pre-processor 101 individually performs pre-processes such as additional block encoding, block interleaving, and byte-expansion. Thereafter, the enhanced data, which are identified in accordance with the importance (or priority) of the corresponding data, maintain the identified state and are then outputted to the packet formatter 102. The detailed operation of the pre-processor will be described in detail in a later process.

Based upon the control of the scheduler 105, the packet formatter 102 multiplexes the pre-processed enhanced data are grouped into a plurality of packet units. Herein, the data packet corresponds to 184-byte unit enhanced data packets having a 4-byte MPEG header added thereto, thereby outputting a 188-byte enhanced data packet. The enhanced data packet may be configured of enhanced data only, or configured of known data (or known data place holder) only, or configured of enhanced data multiplexed with known data. The configuration of the enhanced data group in the packet formatter 102 will be described in detail in a later process.

The output of the packet formatter 102 is inputted to the packet multiplexer 103. Based on the control of the scheduler 105, the packet multiplexer 103 time-division multiplexes the main data packet and the enhanced data group in transport stream (TS) packet units and outputs the multiplexed TS packet to the data randomizer 104. More specifically, the scheduler 105 generates and outputs a control signal so that the packet formatter 102 can multiplex the main data packet and the enhanced data packet group. Accordingly, the packet multiplexer 103 receives the control signal, thereby multiplexing and outputting the main data packet and the enhanced data packet group to TS packet units.

The output data of the packet multiplexer 103 are inputted to the data randomizer 104. The data randomizer 104 discards (or deletes) the MPEG synchronization byte and randomizes the remaining 187 bytes by using a pseudo-random byte, which is generated from inside the data randomizer 104. Thereafter, the randomized data are outputted to the Reed-Solomon (RS) encoder/non-systematic RS parity place holder inserter 106. The RS encoder/non-systematic RS parity place holder inserter 106 processes the randomized data with either a systematic RS-coding process or a non-systematic RS parity place holder insertion process.

The output of the RS encoder/non-systematic RS parity place holder inserter 106 is outputted to the data interleaver 107. The data interleaver 107 then interleaves and outputs the received data. At this point, the data interelayer 107 receives the RS parity byte being newly calculated and outputted from the non-systematic RS encoder 112. Thereafter, the newly calculated and received RS parity byte replaces the non-systematic RS parity place holder that is not yet outputted. More specifically, if the randomized 187-byte data packet corresponds to the main data packet, a systematic RS encoding process is performed as in the conventional broadcast system so as to add a 20-byte parity at the end of the 187-byte data. Then, the processed data are interleaved. On the other hand, if the randomized 187-byte data packet corresponds to the enhanced data packet, a 20-byte non-systematic RS parity place holder is inserted in the randomized data packet, and data bytes within the enhanced data packet are inserted in each place of the remaining 187 data bytes. Thereafter, the processed data are interleaved.

Figure 4:
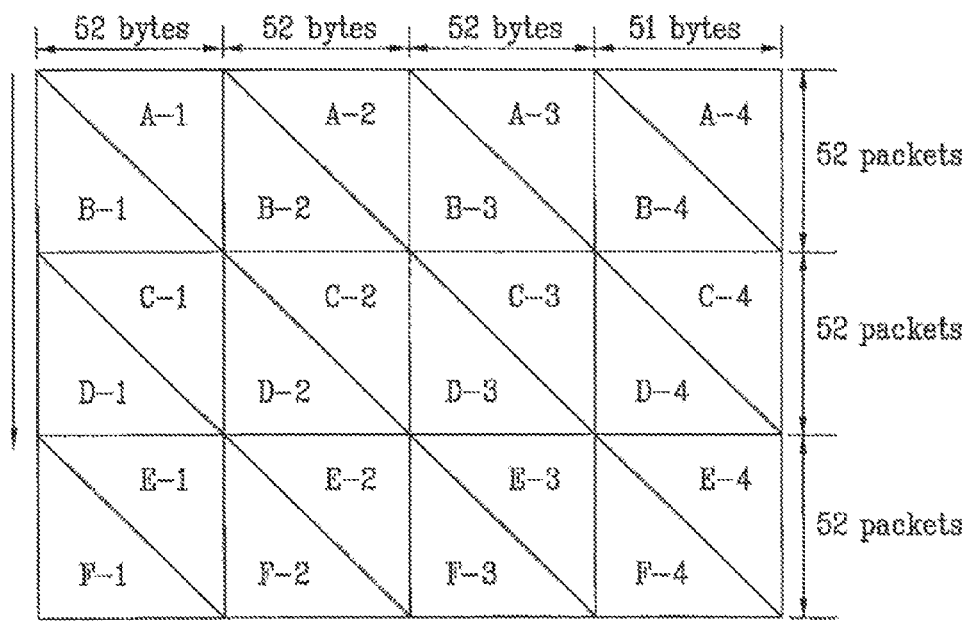
FIG. 4 and FIG. 5 illustrate examples of data structures located before and after the data interleaver in the digital broadcast transmitting system according to the present invention.
Figure 5:
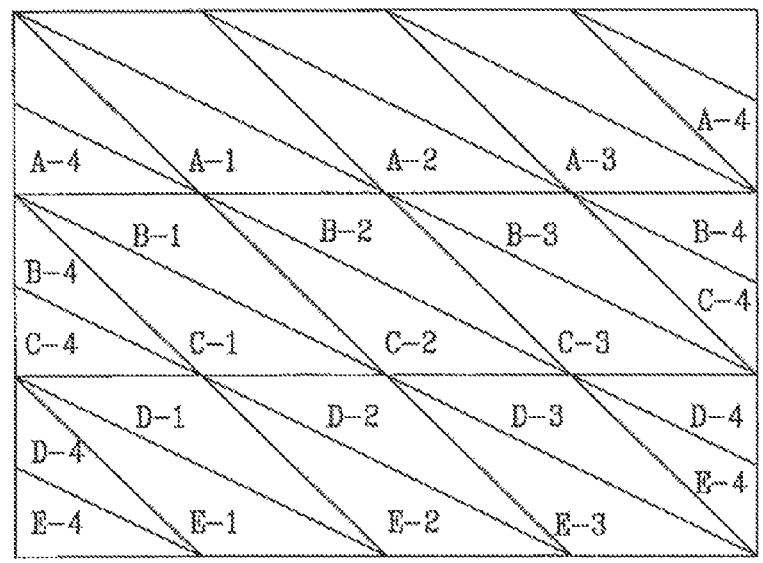

FIG. 4 and FIG. 5 illustrate examples of data structures located before and after the data interleaver 107 in the digital broadcast transmitting system according to the present invention. Referring to FIG. 4, the data being inputted to the data interleaver 107 are inputted in packet units starting from top to bottom and from left to right. And, referring to FIG. 5, the data being outputted from the data interleaver 107 are outputted in packet units starting from bottom to top and from right to left. More specifically, as shown in FIG. 4, among the output data of the data interleaver 107, data A are first outputted, then a combination of data B and data C are outputted, followed by a combination of data D and data E. Finally, data F are outputted last to form the data structure shown in FIG. 5. Furthermore, when a plurality of data packets are outputted in groups, it can be assumed that 104 packets of data A, B, C, and D are outputted as a single enhanced data group, as shown in FIG. 4. In this case, based on the structure of the data outputted from the data interleaver 107 shown in FIG. 5, the enhanced data of sections B and C may be outputted consecutively. However, the enhanced data of section A or section D is mixed with the main data when being outputted from the data interleaver 107.

In the present invention, the enhanced data group may be identified into three hierarchical layers, which may be referred to as a head area, a body area, and a tail area. More specifically, after performing the data interleaving process, the portion of the enhanced data group that is outputted first corresponds to the head area. The portion outputted next corresponds to the body area, and the portion outputted last eventually corresponds to the tail area. Herein, after performing the data interleaving process, the body area is allocated so that the area includes at least a portion or the entire data area in which the enhanced data within the enhanced data packet are continuously outputted. Herein, the body area may also include an area in which enhanced data are outputted non-continuously.

Figure 6:
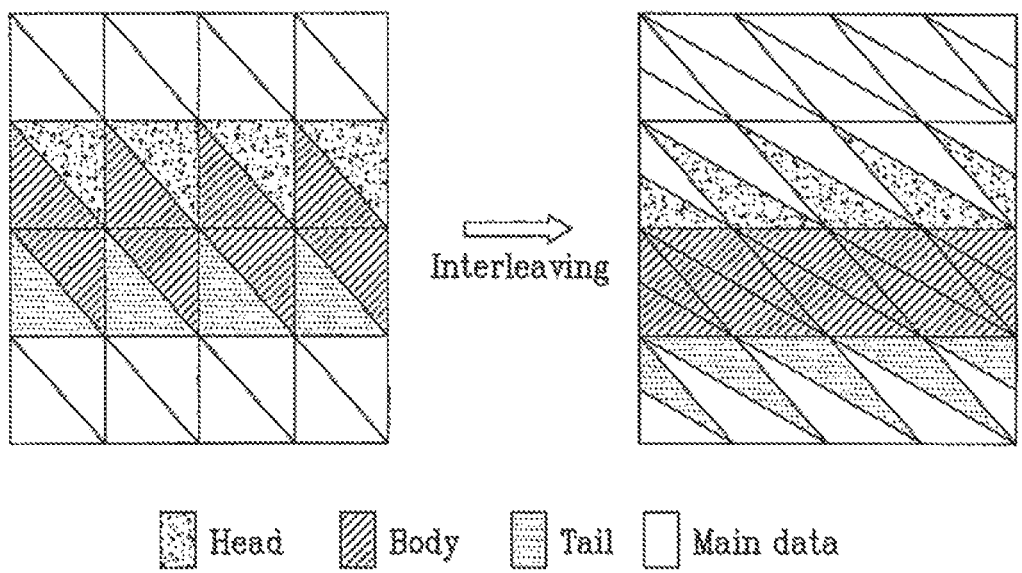
FIG. 6 illustrates exemplary structures of enhanced data groups according to the present invention.

FIG. 6 illustrates exemplary structures of enhanced data groups according to the present invention. More specifically, FIG. 6 illustrates an example of a constant number of enhanced data packets gathered (or grouped) to form a group and also an example of dividing the correspond group to head, body, and tail areas. Referring to FIG. 6, the structure on the left side corresponds to a data structure prior to data interleaving, and the structure on the right side corresponds to a data structure after data interleaving. Herein, FIG. 6 illustrates an example of 104 data packets configuring an enhanced data group. Since the data interleaver 107 operates periodically in a cycle of 52-packet units, in this example, the enhanced data group is configured to include multiples of the 54-packet unit. Furthermore, in the data structure at the output end of the data interleaver, the body area is configured to have the shape a square. In other words, in the example shown in FIG. 6, the body area of the enhanced data group is configured so that only the enhanced data are included in this area without being mixed with the main data.

Herein, the enhanced data group is divided into 3 different areas in order to differentiate the purpose of each area. More specifically, referring to FIG. 6, the body area is configured only of the enhanced data without having any interference from the main data, thereby showing the excellent (or strong) receiving performance. On the other hand, the enhanced data included in the head and tail areas are inter-mixed with the main data due to the output order of the enhanced data. Therefore, the receiving performance of the head and tail areas are more deteriorated than that of the body area.

Also, when using a broadcast system that inserts known data in the enhanced data and transmits the enhanced data including known data, and when long known data sequences are to be periodically and consecutively inserted in the enhanced data, it is possible to insert the known data in an area wherein the enhanced data are not mixed with the main data in accordance with the output order. In other words, known data having a predetermined length may be periodically inserted in the body area of the structure shown in FIG. 6. However, it is difficult to periodically insert consecutive known data in the head and tail areas, and it is practically impossible to insert long known data sequences in the head and tail areas. At this point, initialization data for initializing the memory within the trellis encoder 113 are allocated at the beginning of the known data sequence.

Additionally, when identifying the enhanced data group into head, body, and tail areas, different services may be assigned according to each area. Assuming that the enhanced data are divided into high priority enhanced data and low priority enhanced data, the high priority enhanced data and the low priority enhanced data may be appropriately allocated to any one of the head, body, and tail areas within the enhanced data group. For example, the body area is allocated with the high priority enhanced data, and the head and tail areas are allocated with the low priority enhanced data.

Therefore, when the enhanced data are inserted, the pre-processor 101 takes into consideration the enhanced data type that are being inputted and the area of the enhanced data group in which data are to be allocated, so as to perform pre-processes, such as additional block encoding, block interleaving, and byte expansion, on the inputted enhanced data. Alternatively, any one of the enhanced data type and the area in which data are to be allocated may be considered, in order to perform the above-mentioned pre-processes.

Figure 2:
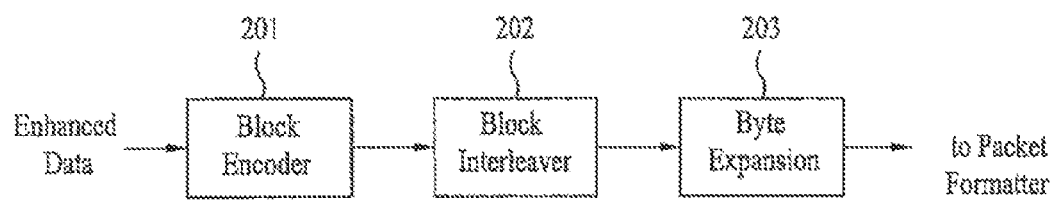
FIG. 2 and FIG. 3 illustrate block diagrams each showing an example of the pre-processor shown in FIG. 1.
Figure 3:
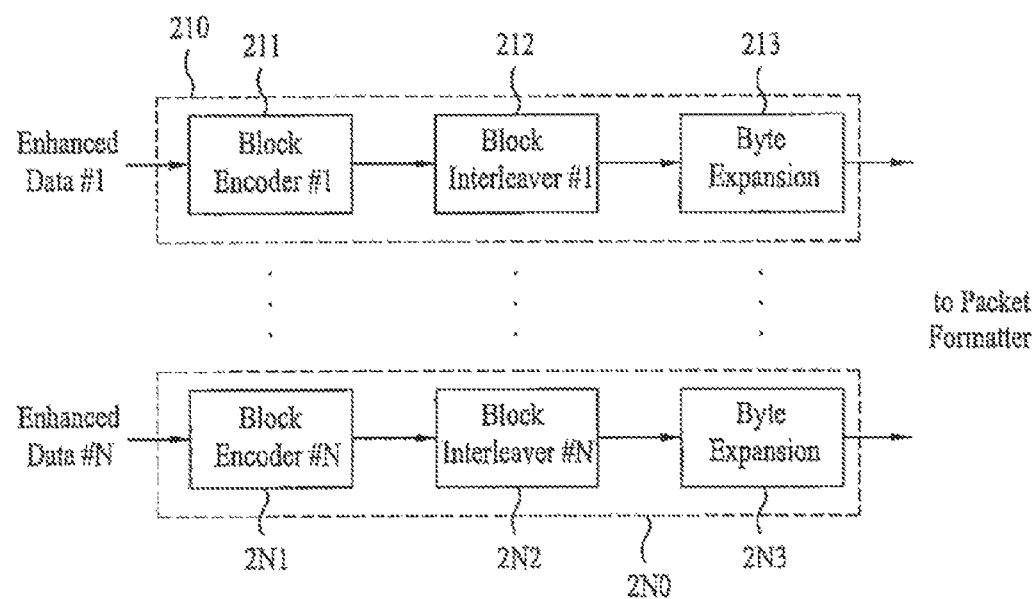

FIG. 2 and FIG. 3 illustrate block diagrams each showing an example of the pre-processor 101 shown in FIG. 1. More specifically, FIG. 2 illustrates an example of the pre-processor performing integrated pre-processes regardless of type of enhanced data being inputted. FIG. 3 illustrates an example of the pre-processor performing separate (or individual) pre-processes corresponding to each type of enhanced data that being inputted.

Referring to FIG. 2, the pre-processor 101 includes a block encoder 201, a block interleaver 202, and a byte expansion unit 203. The block encoder 201 encodes the enhanced data that are being inputted by using a block coding method. For example, the block encoder 201 may use a block code of a RS encoder, a convolutional encoder, and a low density parity check (LDPC) encoder. And, depending upon the purpose of the embodiment, the block interleaver 202 may be selectively used. The method of adopting the block interleaver is related to the overall system performance and may consist of any type of data interleaving method including random interleaving. At this point, a block size should be decided in order to allow the block encoder 201 to perform a coding process in block units, and to allow the block interleaver 202 to perform a block interleaving process.

For example, when one block size is configured of the number of enhanced data bits included in the body area within the enhanced data group, and when another block size is configured of the added number of enhanced data bits included in both head and tail areas within the enhanced data group, the two blocks have almost the same size. This principle may be verified by referring to FIG. 6. However, the block size presented in this embodiment of the present is merely exemplary and, therefore, is not limited to the examples set forth herein. This is because if the beginning and end of the block is decided so that the enhanced data have a limited length, any block size may be used in the present invention. Once the coding process is performed by using the block coding method, the block interleaved data are processes with byte expansion at the byte expansion unit 203 by inserting null bits. The byte expansion unit 203 may expand 1 data byte to 2 data bytes, 4 data bytes, or more data bytes by inserting null bits or repeating the data bits.

Referring to FIG. 3, the pre-processor 101 includes a number of block encoders, block interleavers, and byte expansion units corresponding to the number of enhanced data types that are to be individually (or separately) processed with pre-processes. At this point, different types of block encoding, block interleaving, and byte expansion processes may be performed for each enhanced data type, respectively. In this embodiment of the present invention, when the enhanced data are divided into high priority enhanced data and low priority enhanced data, the pre-processor 101 may included at least 2 sets of block encoder, block interleaver, and byte expansion unit. As shown in FIG. 3, it is assumed that high priority enhanced data are coded and byte-expanded by a first encoder 210 and that low priority enhanced data are coded and byte-expanded by a second (or $N^{th}$) encoder 2N0. It is also assumed that the high priority enhanced data are allocated to the body area of the enhanced data group by the packet formatter 102 and that the low priority enhanced data are allocated to the head and tail areas of the enhanced data group by the packet formatter 102.

In this case, the coding rate of the block encoder 211 included in the first encoder 210 may be set to be higher than the coding rate of the block encoder 2N1 included in the second encoder 2N0, thereby increasing the actual data rate. This is because excellent receiving performance is expected from the body area and because relatively deteriorated receiving performance is expected from the head and tail areas. Conversely, since the data allocated to the body area may correspond to important data, the coding rate of the block encoder 211 included in the first encoder 210 may be set to be lower than the coding rate of the block encoder 2N1 included in the second encoder 2N0. Accordingly, although the data rate may be lower, the pre-processor 101 may be provided with excellent error correction capacity.

For example, the block encoder 211 within the first encoder 210 uses a 9/10 LDPC having a coding rate of 9/10. The block encoder 2N1 within the second encoder 2N0 uses a ½ LDPC having a coding rate of ½, and a ½ convolution encoder. Conversely, the block encoder 211 within the first encoder 210 uses a ½ LDPC having a coding rate of ½, and a ½ convolution encoder. Also, the block encoder 2N1 within the second encoder 2N0 uses a 9/10 LDPC having a coding rate of 9/10. However, the block encoders are only exemplary, and each of the block encoders may use encoders having other coding rates. Therefore, the present invention is not limited to the examples set forth herein.

After the block decoding and block interleaving processes are performed according to each enhanced data type in each encoder, byte expansion is performed in each of the byte expansion units. In this case, also, depending upon the enhanced data type and depending upon the type of data allocated in each area within the enhanced data group, byte expansion in each byte expansion unit may be performed to expand the bytes either to the same number or to different numbers. For example, a 4-byte expansion may be performed on the high priority enhanced data, and a 2-byte expansion may be performed on the low priority enhanced data. Alternatively, a 2-byte expansion may be performed on the high priority enhanced data, and a 4-byte expansion may be performed on the low priority enhanced data. This is an option that may be chosen and decided by the designer of the system and the scope of the present invention is not limited to the examples presented herein. Subsequently, the enhanced data processed with byte expansion in each byte expansion unit are inputted to the packet formatter 102. More specifically, the enhanced data that have been pre-processed differently depending upon the type of enhanced data are inputted to the packet formatter 102, while maintaining each different state (or type).

The packet formatter 102 appropriately allocates the inputted enhanced data to each the head, body, and tail areas within the enhanced data group. For example, the high priority enhanced data are allocated to body area, and the low priority enhanced data are allocated to the head and tail areas. More specifically, the enhanced data group is configured in the packet formatter 102 so that the interleaved enhanced data can be appropriately allocated to each of the head, body, and tail areas depending upon the enhanced data type. Then, the pre-defined known data (or known data place holder) are inserted in each specific position (or place) within the enhanced data group according to a regular and constant rule. Thereafter, the inserted known data are outputted to the packet multiplexer 103 in 188-byte MPEG packet units.

The packet multiplexer 103 time-division multiplexes the main data packet and the enhanced data packet group in transport stream (TS) packet units and outputs the multiplexed TS packet in accordance with the control of the scheduler 105. As described above, the output of the packet multiplexer 103 passes through the data randomizer 104, RS encoder/non-systematic RS parity place holder inserter 106, the data interleaver 107 and is, then, inputted to the byte-symbol converter 108. The one byte being outputted from the data interleaver 107 is converted into 4 symbols by the byte-symbol converter 108 and then 12-way interleaved. Subsequently, the 12-way interleaved symbols are outputted to the symbol processor 109. Herein, one symbol is configured of 2 bits.

The known data generated from the known data generator 110 are also outputted to the symbol processor 109. At this point, the known data correspond to the known data symbols generated in the symbol domain. Since the known data are used in the symbol domain of the receiving system, it is more effective to create (or generate) a symbol sequence of the known data having the characteristics required by the symbol domain in the transmitting system as well. Meanwhile, when the data being inputted to the symbol processor 109 correspond to the known data place holder converted into symbols by the byte-symbol converter 108, the symbol processor 109 uses the known data generated from the known data generator 110 instead of the known data place holder. The symbol processor 109 then generates a known data symbol at the beginning of the known data sequence so that the memory of the trellis encoder 113 is initialized to a pre-decided state. In order to do so, the memory value within the trellis encoder 113 should be inputted to the symbol processor 109.

Further, the memory value of the trellis encoder 113 may also be used in an additional signaling process for the enhanced data symbol. Additionally, the trellis encoder 113 is initialized at the beginning of the known data sequence because a plurality of output sequences may be generated depending upon the memory state of the trellis encoder 113 even when the known data sequence is inputted to the trellis encoder 113. Accordingly, the memory state of the trellis encoder 113 is first initialized to a pre-decided value and, then, when the known data are inputted, a desired known data output sequence may be obtained from the output of the trellis encoder 113. The output symbol of the symbol processor 109 is inputted to the trellis encoder 113 so as to be trellis-encoded.

The trellis encoder 113 pre-codes the data that are inputted as the upper bit among the output symbols of the symbol processor 109, and trellis-encodes the data that are inputted as the lower bit. Thereafter, the pre-coded data and the trellis-encoded data are outputted to the frame multiplexer 114. Meanwhile, the symbol processor 109 receives the 2-bit symbol, processes the received symbol with a plurality of process steps, and outputs the processed symbol. Therefore, the symbol should be converted back to bytes from the symbol-byte converter 111 so that the non-systematic RS encoder 112 can recalculate the RS parity from the output of the symbol processor 109. In other words, the input symbol is converted to byte units from the symbol-byte converter 111 and 12-way interleaved. Thereafter, the 12-way interleaved symbol is outputted to the non-systematic RS encoder 112. The non-systematic RS encoder 112 calculates the 20-byte RS parity for the data packet configured of 187 information bytes and outputs the calculated RS parity to the data interleaver 107. The data interleaver 107 receives the RS parity byte calculated and outputted from the non-systematic RS encoder 112 and replaces the non-systematic place holder that is not yet outputted with the received RS parity byte.

Herein, since the enhanced data symbol and the known data place holder are changed to different values by the symbol processor 109, a decoding error occurs when performing a RS decoding process in the conventional receiving system. In other words, this is to provide backward compatibility with the conventional receiving system. Meanwhile, the non-systematic RS encoder 112 receives the output of the known data generator 110 so that the symbol-byte converter 111 can receive in advance the known data being outputted later than the RS parity byte.

The frame multiplexer 114 inserts 4 segment synchronization symbols in each output symbol of the trellis encoder 113, thereby configuring a data segment having 832 data symbols. More specifically, one field synchronization segment is inserted in each of the 312 data segments, so as to configure one data field, which is then outputted to the transmitting unit 120. The transmitting unit 120 inserts a pilot signal in the output of the frame multiplexer 114, the output having a segment synchronization signal and a field synchronization signal inserted therein. The transmitting unit 120 then modulates the pilot signal inserted data and converts the modulated data to an RF signal, which is transmitted through the antenna. Accordingly, the transmitting unit 120 includes a pilot inserter 121, a modulator 122, and a RF-UP converter 123. Furthermore, a pre-equalizer filter may be optionally included.

Figure 7:
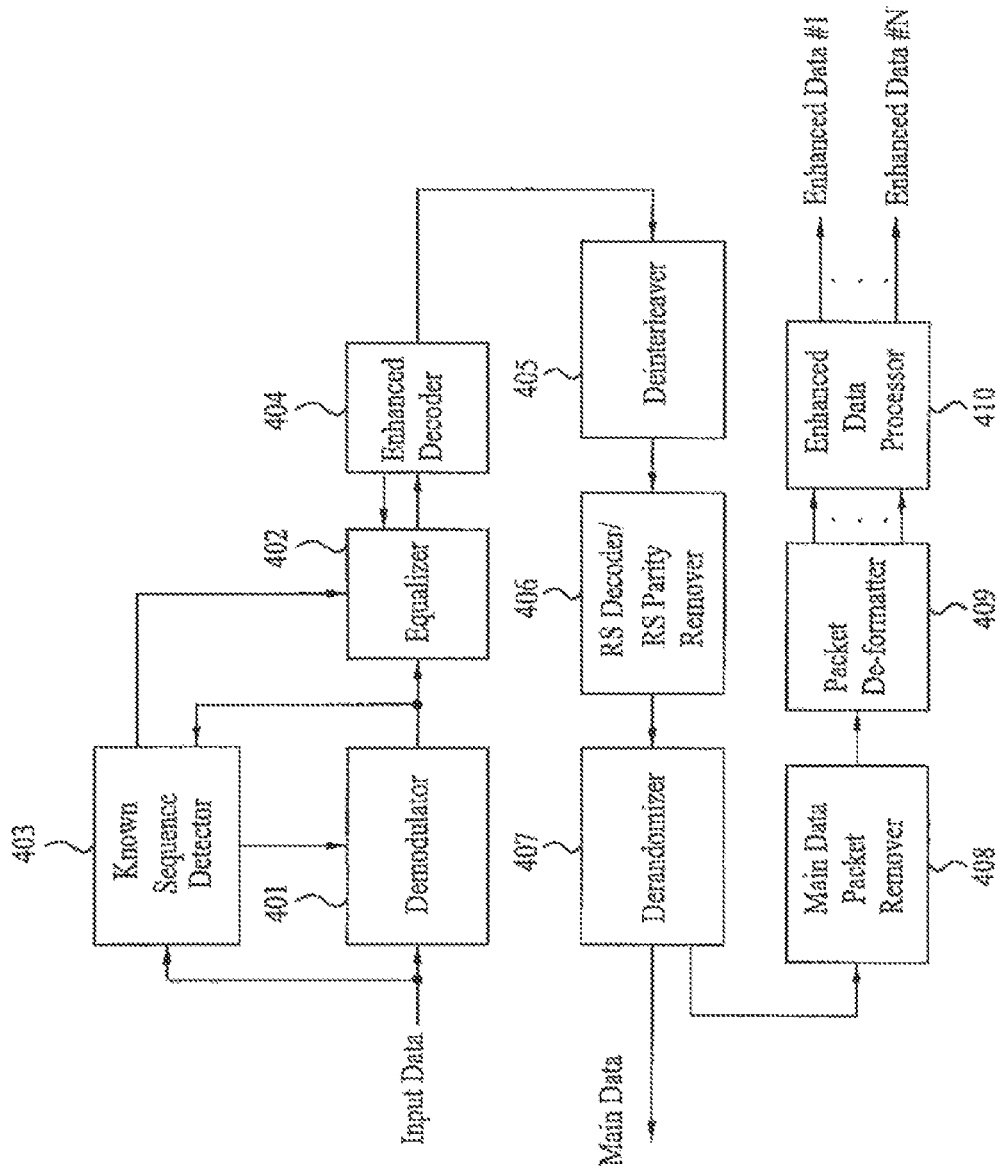
FIG. 7 illustrates a block diagram showing the structure of a demodulating unit included a digital broadcast receiving system according to the present invention.

FIG. 7 illustrates a block diagram showing the structure of a demodulating unit including a digital broadcast receiving system according to the present invention. More specifically, FIG. 7 illustrates a demodulating unit receiving data transmitted from the digital broadcast transmitting system so as to demodulate and equalized the received data, thereby recovering the processed data to the initial state. Referring to FIG. 7, the demodulating unit includes a demodulator 401, an equalizer 402, a known sequence detector 403, an enhanced decoder 404, a data deinterleaver 405, a RS decoder/non-systematic RS parity remover 406, and a derandomizer 407. The digital broadcast receiving system further includes a main data packet remover 408, a packet deformatter 409, and an enhanced data processor 410.

More specifically, a tuner tunes a frequency of a specific channel and then outputs it to the demodulator 401 and the known sequence detector 403. The demodulator 401 performs self gain control, carrier recovery, and timing recovery processes on the inputted frequency, thereby modifying to a baseband signal. Then, the demodulator 401 outputs the newly created baseband signal to the equalizer 402 and the known sequence detector 403. The equalizer 402 compensates the distortion of the channel included in the demodulated signal and then outputs the error-compensated signal to the enhanced decoder 404.

At this point, the known sequence detector 403 detects the known sequence place inserted by the transmitting end from the input/output data of the demodulator 401 (i.e., the data prior to the demodulation or the data after the modulation). Thereafter, the place information along with the symbol column of the known sequence, which is generated from the detected place, is outputted to the demodulator 401 and the equalizer 402. The demodulator 401 uses the known data symbol column during the timing and/or carrier recovery, thereby enhancing the demodulating quality. Similarly, the equalizer 402 uses the known data sequence, thereby enhancing the equalizing quality.

Meanwhile, the data being inputted to the enhanced decoder 404 from the equalizer 402 may either correspond to main data or known data that are processed with trellis-encoding only without being processed with any other additional coding processes or correspond to enhanced data being processed with additional coding and trellis-encoding processes. If the inputted data correspond to the main data or the known data (or the known data place holder), the enhanced decoder 404 either performs viterbi-decoding on the input data or performs hard decision on a soft decision value. Thereafter, one of the Viterbi-decoded result or the hard-decided result may be outputted. Furthermore, the RS parity byte and the MPEG header byte, which have been added to the enhanced data packet by the transmitting system, are also considered as the main data by the transmitting system and are not processed with additional coding. Therefore, the enhanced decoder 404 either performs Viterbi-decoding on the RS parity byte and the MPEG header byte or performs hard decision on a soft decision value. Thereafter, one of the Viterbi-decoded result or the hard-decided result of the RS parity byte and the MPEG header byte may be outputted.

Meanwhile, when the inputted data correspond to the enhanced data, the enhanced decoder 404 outputs a soft decision value on the inputted enhanced data. This process is performed to enhance the additional error correction decoding performance of the enhanced data processor 410 on the inputted enhanced data. Accordingly, the enhanced data processor 410 receives the above-described soft decision value so as to perform an additional error correction decoding process. More specifically, the enhanced data processor 410 performs additional error correction decoding on the soft-decided enhanced data. Herein, any one of a RS decoder, a convolution decoder, a low density parity check (LDPC) code decoder, and a turbo decoder may be used as the error correction decoder. At this point, the decoding result of the enhanced decoder 404 may also be fed-back to the equalizer 402, thereby enhancing the equalizing performance.

More specifically, when the inputted data correspond to the enhanced data, the enhanced decoder 404 performs a decoding process on the data processed by the trellis encoder 113 and the symbol processor 109 of the digital broadcast transmitting system (or the DTV transmitter). At this point, the data outputted from a block encoder of the pre-processor may correspond to an external code, and the data outputted from any one of the symbol processor 109 and the trellis encoder 113 may correspond to an internal code.

Therefore, in order to maximize, the coding performance of the external code when decoding such concatenated codes, a soft decision value should be outputted from the decoder of the internal code. For this reason, it is preferable that the enhanced decoder 404 outputs a soft decision value of the enhanced data and not a hard decision value. The algorithm for outputting the soft decision value on the convolution-coded enhanced data includes a soft output Viterbi algorithm (SOVA) and a maximum a posteriori (MAP) algorithm.

Herein, in light of symbol errors, the MAP algorithm has a better performance. However, the MAP algorithm is disadvantageous in that an optimum MAP algorithm requires probabilities (or likelihood) to be calculated in an exponential domain and noise dispersion within channels to be estimated. Among many MAP algorithms, a suboptimum soft output algorithm (SSA) shows the least decrease in performance, calculates probabilities (or likelihood) in a log domain, and does not require any estimation of noise dispersion.

The output of the enhanced decoder 404 is inputted to the deinterleaver 405. The deinterleaver 405 performs an inverse process of the data interleaver included in the transmitting system. Thereafter, the deinterleaved data are outputted to the RS decoder/non-systematic RS parity remover 406. If the packet received from the RS decoder/non-systematic RS parity remover 406 corresponds to the main data packet, then a systematic RS decoding process is performed. On the other hand, if the packet received from the RS decoder/non-systematic RS parity remover 406 corresponds to the enhanced data packet, then the non-systematic RS parity byte that is inserted in the data packet is removed, and the parity-removed data are outputted to the derandomizer 407.

The derandomizer 407 receives the output of the RS decoder/non-systematic RS parity remover 406 and generates a pseudo random data byte identical to that of the randomizer included in the digital broadcast transmitting system (or DTV transmitter). Thereafter, the derandomizer 407 performs a bitwise exclusive OR (XOR) operation on the generated pseudo random data byte, thereby inserting the MPEG synchronization bytes to the beginning of each packet so as to output the data in 188-byte main data packet units. The output of the derandomizer 407 is outputted to the main MPEG decoder not shown) and the main data packet remover 408, at the same time. The main MPEG decoder decodes only the data packet corresponding to the main MPEG. This is because the enhanced data packet, which includes a null data packet or a reserved PID that is not used in the main data service, is not decoded by the main MPEG decoder and simply ignored.

However, it is difficult to perform a bitwise exclusive OR (XOR) operation between the soft decision value of the enhanced data bit and the pseudo random bit. Accordingly, as described above, a hard decision is performed on the data outputted to the main MPEG decoder in accordance with the soft decision value of the coder. Thereafter, a XOR operation is performed between the hard decided output data and the pseudo random bit. More specifically, when the soft decision value is a positive number, the output data are decided as '1', and when the soft decision value is a negative number, the output data are decided as '0'. And, a XOR operation is performed between such decision value and the pseudo random bit.

As described above, in the enhanced data processor 410, a soft decision is needed in order to enhance the performance when decoding the error correction code. Therefore, the derandomizer 407 creates a separate output with respect to the enhanced data and outputs the newly created output to the main data packet remover 408. For example, when an XOR operation is performed between the pseudo random bit and the soft decision value of the enhanced data bit, and when the pseudo random bit is equal to '1', the derandomizer 407 changes the code of the soft decision value and then outputs the changed code. On the other hand, if the pseudo random bit is equal to '0', the derandomizer 407 outputs the soft decision value without any change in the code.

If the pseudo random bit is equal to '1' as described above, the code of the soft decision value is changed because, when an XOR operation is performed between the pseudo random bit and the input data in the randomizer of the transmitting system, and when the pseudo random bit is equal to '1', the code of the output data bit becomes the opposite of the input data (i.e., 0 XOR1=1 and 1 XOR 0=0). More specifically, if the pseudo random bit generated from the derandomizer 407 is equal to '1', and when an XOR operation is performed on the hard decision value of the enhanced data bit, the XOR-operated value becomes the opposite value of the hard decision value. Therefore, when the soft decision value is outputted, a code opposite to that of the soft decision value is outputted.

The main data packet remover 408 only obtains and outputs the enhanced data packet from the output of the derandomizer 407. More specifically, the main data packet remover 408 removes the 188-byte unit main data packet from the output of the derandomizer 407. Then, the main data packet remover 408 only obtains the enhanced data packet and outputs the obtained data packet to the packet deformatter 409. The packet deformatter 409 removes the MPEG header from the output data so as to obtain a 184-byte packet.

Herein, the MPEG header has a PID for the enhanced data, which have been inserted by the transmitting system (or end) so as to be differentiated from the main data packet. Such 184-byte data packets are gathered (or grouped) to form a group having a predetermined size. Thereafter, the known data (or the known data place holder) that have been inserted for the demodulation and equalization by the transmitting system are removed from a predetermined place (or position). Then, the enhanced data of the head, body, and tail areas within the enhanced data group are identified and outputted to the enhanced data processor 410. More specifically, the pre-processed enhanced data are individually identified by data type and then outputted from the pre-processor of the transmitting system. The output of the packet deformatter 409 is inputted to the enhanced data processor 410.

The enhanced data processor 410 performs block-deinterleaving and block-decoding of the error correction code with respect to the enhanced data that are soft-decided and outputted. In other words, the enhanced data processor 410 performs an inverse operation of the pre-processor of the transmitting system. In the pre-processor of the transmitting system, additional block-coding, block-interleaving, and byte expansion processes are separately (or individually) performed on the enhanced data that are inserted in accordance with the corresponding data type. Herein, the byte expansion process is performed by inserting null bits or by repeating input bits.

Therefore, the enhanced data processor 410 individually performs an inverse process of the pre-processor included in the transmitting system on each set of enhanced data, which are inserted in accordance with the enhanced data type. Accordingly, the enhanced data processor 410 outputs the final enhanced data, which are identified in accordance with the importance or priority of the corresponding data as in the transmitting system. More specifically, the enhanced data processor 410 removes the null bits or the repetition bits, which have been inserted by the pre-processor for the byte expansion process, from the soft-decided enhanced data in accordance with each enhanced data type. Thereafter, a block-deinterleaving process and a block-decoding process are performed so as to output the finally processed enhanced data. For example, the final enhanced data are identified and outputted as high priority enhanced data and low priority enhanced data.

Figure 8:
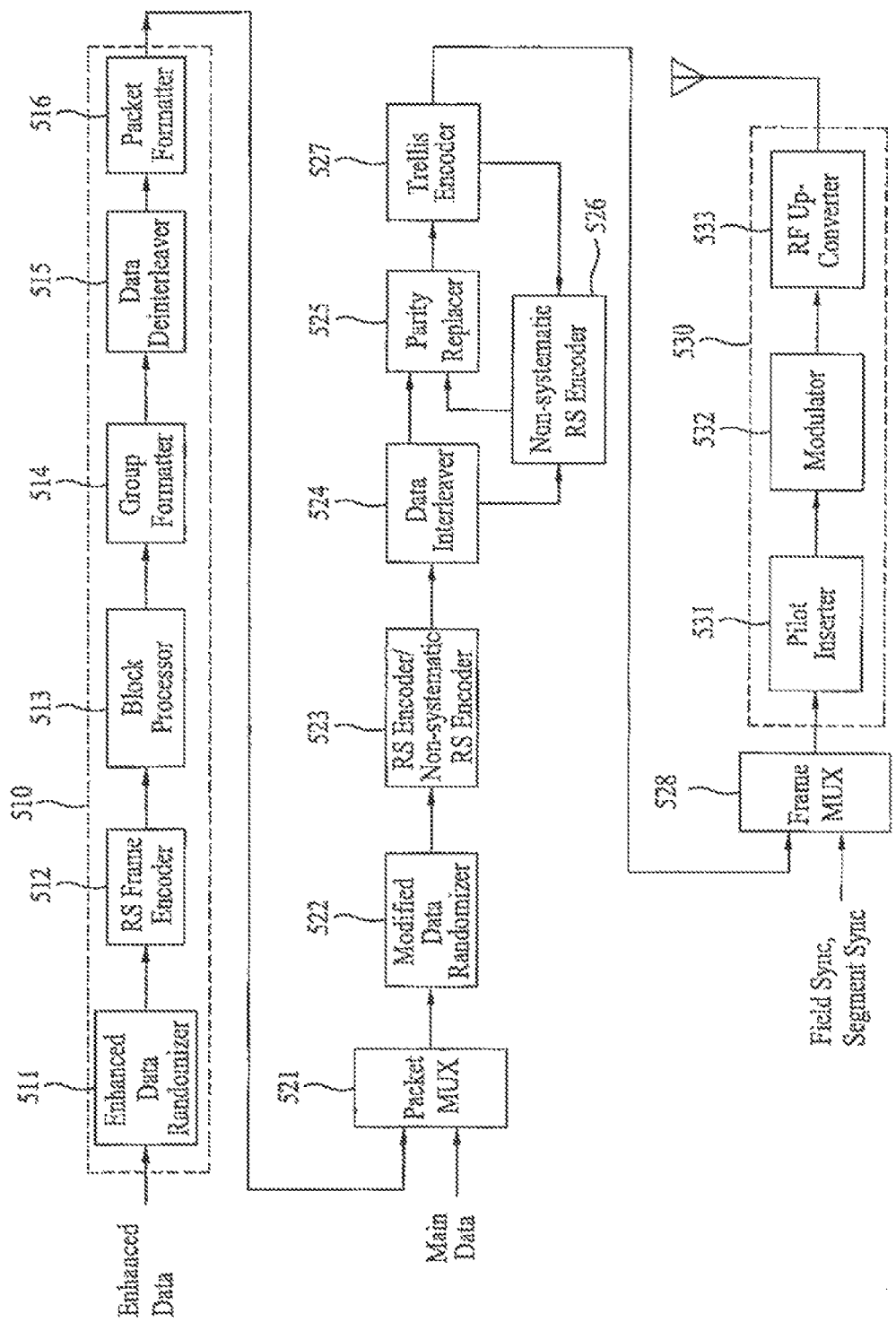
FIG. 8 illustrates a block diagram of a digital broadcast (or television or DTV) transmitting system according to another embodiment of the present invention.

FIG. 8 illustrates a block diagram showing the structure of a digital broadcast transmitting system according to an embodiment of the present invention. The digital broadcast transmitting system includes a pre-processor 510, a packet multiplexer 521, a data randomizer 522, a Reed-Solomon (RS) encoder/non-systematic RS encoder 523, a data interleaver 524, a parity byte replacer 525, a non-systematic RS encoder 526, a frame multiplexer 528, and a transmitting unit 530. The pre-processor 510 includes an enhanced data randomizer 511, a RS frame encoder 512, a block processor 513, a group formatter 514, a data deinterleaver 515, and a packet formatter 516.

In the present invention having the above-described structure, main data are inputted to the packet multiplexer 521. Enhanced data are inputted to the enhanced data randomizer 511 of the pre-processor 510, wherein an additional coding process is performed so that the present invention can respond swiftly and appropriately against noise and change in channel. The enhanced data randomizer 511 randomizes the received enhanced data and outputs the randomized enhanced data to the RS frame encoder 512. At this point, by having the enhanced data randomizer 511 perform the randomizing process on the enhanced data, the randomizing process on the enhanced data by the data randomizer 522 in a later process may be omitted. Either the randomizer of the conventional broadcast system may be used as the randomizer for randomizing the enhanced data, or any other type of randomizer may be used herein.

The RS frame encoder 512 receives the randomized enhanced data and performs at least one of an error correction coding process and an error detection coding process on the received data. Accordingly, by providing robustness to the enhanced data, the data can scatter group error that may occur due to a change in the frequency environment. Thus, the data can respond appropriately to the frequency environment which is very poor and liable to change. The RS frame multiplexer 512 also includes a process of mixing in row units many sets of enhanced data each having a pre-determined size. By performing an error correction coding process on the inputted enhanced data, the RS frame encoder 512 adds data required for the error correction and, then, performs an error detection coding process, thereby adding data required for the error detection process. The error correction coding uses the RS coding method, and the error detection coding uses the cyclic redundancy check (CRC) coding method. When performing the RS coding process, parity data required for the error correction are generated. And, when performing the CRC coding process, CRC data required for the error detection are generated.

The RS frame encoder 512 performs CRC coding on the RS coded enhanced data in order to create the CRC code. The CRC code that is generated by the CRC coding process may be used to indicate whether the enhanced data have been damaged by an error while being transmitted through the channel. The present invention may adopt other types of error detection coding methods, apart from the CRC coding method, and may also use the error correction coding method so as to enhance the overall error correction ability of the receiving system. For example, assuming that the size of one RS frame is 187*N bytes, that (235, 1137)-RS coding process is performed on each column within the RS frame, and that a CRC coding process using a 2-byte (i.e., 16-bit) CRC checksum, then a RS frame having the size of 187*N bytes is expanded to a RS frame of 235*(N+2) bytes. The RS frame expanded by the RS frame encoder 512 is inputted to the block processor 513. The block processor 513 codes the RS-coded and CRC-coded enhanced data at a coding rate of G/H. Then, the block processor 513 outputs the G/H-rate coded enhanced data to the group formatter 514. In order to do so, the block processor 513 identifies the block data bytes being inputted from the RS frame encoder 512 as bits.

The block processor 513 may receive supplemental information data such as signaling information, which include information on the system, and identifies the supplemental information data bytes as data bits. Herein, the supplemental information data, such as the signaling information, may equally pass through the enhanced data randomizer 511 and the RS frame encoder 512 so as to be inputted to the block processor 513. Alternatively, the supplemental information data may be directly inputted to the block processor 513 without passing through the enhanced data randomizer 511 and the RS frame encoder 512. The signaling information corresponds to information required for receiving and processing data included in the data group in the receiving system. Such signaling information includes data group information, multiplexing information, and burst information.

As a G/H-rate encoder, the block processor 513 codes the inputted data at a coding rate of G/H and then outputs the G/H-rate coded data. For example, if 1 bit of the input data is coded to 2 bits and outputted, then G is equal to 1 and H is equal to 2 (i.e., G=1 and H=2). Alternatively, if 1 bit of the input data is coded to 4 bits and outputted, then G is equal to 1 and H is equal to 4 (i.e., G=1 and H=4). As an example of the present invention, it is assumed that the block processor 513 performs a coding process at a coding rate of ½ (also referred to as a ½-rate coding process) or a coding process at a coding rate of ¼ (also referred to as a ¼-rate coding process). More specifically, the block processor 513 codes the received enhanced data and supplemental information data, such as the signaling information, at either a coding rate of ½ or a coding rate of ¼. Thereafter, the supplemental information data, such as the signaling information, are identified and processed as enhanced data.

Since the ¼-rate coding process has a higher coding rate than the ½-rate coding process, greater error correction ability may be provided. Therefore, in a later process, by allocating the ¼-rate coded data in an area with deficient receiving performance within the group formatter 514, and by allocating the ½-rate coded data in an area with excellent receiving performance, the difference in the overall performance may be reduced. More specifically, in case of performing the ½-rate coding process, the block processor 513 receives 1 bit and codes the received 1 bit to 2 bits (i.e., 1 symbol). Then, the block processor 513 outputs the processed 2 bits (or 1 symbol). On the other hand, in case of performing the ¼-rate coding process, the block processor 513 receives 1 bit and codes the received 1 bit to 4 bits (i.e., 2 symbols). Then, the block processor 513 outputs the processed 4 bits (or 2 symbols). Additionally, the block processor 513 performs a block interleaving process in symbol units on the symbol-coded data. Subsequently, the block processor 513 converts to bytes the data symbols that are block-interleaved and have the order rearranged.

The group formatter 514 inserts the enhanced data outputted from the block processor 513 (herein, the enhanced data may include supplemental information data such as signaling information including transmission information) in a corresponding area within the data group, which is configured according to a pre-defined rule. Furthermore, in relation with the data deinterleaving process, various types of places holders or known data are also inserted in corresponding areas within the data group. At this point, the data group may be described by at least one hierarchical area. Herein, the data allocated to the each area may vary depending upon the characteristic of each hierarchical area. Additionally, each group is configured to include a field synchronization signal.

The present invention shows an example of the data group being divided into three hierarchical areas: a head area, a body area, and a tail area. Accordingly, in the data group that is inputted for the data deinterleaving process, data are first inputted to the head area, then inputted to the body area, and inputted finally to the tail area. In the example of the present invention, the head, body, and tail areas are configured so that the body area is not mixed with the main data area within the data group. Furthermore, in the present invention, the head, body, and tail areas may each be divided into lower hierarchical areas. For example, the head area may be divided into 3 lower hierarchical areas: a far head (FH) area, a middle head (MH) area, and a near head (NH) area. The body area may be divided into 4 lower hierarchical areas: a first lower body (B1) area, a second lower body (B2) area, a third lower body (B3) area, and a fourth lower body (B4) area. And, finally, the tail area may be divided into 2 lower hierarchical areas: a far tail (FT) area and a near tail (NT) area.

In the example of the present invention, the group formatter 514 inserts the enhanced data being outputted from the block processor 513 to the middle head (MH) area, the near head (NH) area, the first to fourth lower body (B1 to B4) areas, and the near tail (NT) area. Herein, the type of enhanced data may vary depending upon the characteristic of each area. The data group is divided into a plurality of areas so that each area may be used for different purposes. More specifically, areas having less interference with the main data may show more enhanced receiving performance as compared with area having more interference with the main data. Additionally, when using the system in which the known data are inserted in the data group and then transmitted, and when a long set of consecutive known data is to be periodically (or regularly) inserted in the enhanced data, the body area is capable of regularly receiving such enhanced data having a predetermined length. However, since the enhanced data may be mixed with the main data in the head and tail areas, it is difficult to regularly insert the known data in these areas, and it is also difficult to insert long known data sets that are consecutive in these areas.

Details such as the size of the data group, the number of hierarchical areas within the data group and the size of each hierarchical area, and the number of enhanced data bytes that may be inserted in each hierarchical area may vary depending upon the design of the system designer. Therefore, the above-described embodiment is merely an example that can facilitate the description of the present invention. In the group formatter 514, the data group may be configured to include a position (or place) in which the field synchronization signal is to be inserted. When assuming that the data group is divided into a plurality of hierarchical areas as described above, the block processor 513 may code the data that are to be inserted in each area at different coding rates.

In the present invention, based upon the areas that are each expected to show different performance after the equalization process when using the channel information that may be used for the channel equalization process in the receiving system, a different coding rate may be applied to each of these areas. For example, the block processor 513 codes the enhanced data that are to be inserted in the near head (NH) area and the first to fourth lower body (B1 to B4) areas at a ½-coding rate. Thereafter, the group formatter 514 may insert the ½-rate coded enhanced data in the near head (NH) area and the first to fourth lower body (B1 to B4) areas. On the other hand, the block processor 513 codes the enhanced data that are to be inserted in the middle head (MH) area and the near tail (NT) area at a ¼-coding rate, which has greater error correction ability than the ½-coding rate. Subsequently, the group formatter 514 may insert the ½-rate coded enhanced data in the middle head (MH) area and the near tail (NT) area. Furthermore, the block processor 513 codes the enhanced data that are to be inserted in the far head (FH) area and the far tail (FT) area at a coding rate having even greater error correction ability than the ¼-coding rate. Thereafter, the group formatter 514 may inserts the coded enhanced data either in the far head (FH) and far tail (FT) areas or in a reserved area for future usage.

Apart from the enhanced data, the group formatter 513 may also insert supplemental information data such as signaling information indicating the overall transmission information in the data group. Also, apart from the coded enhanced data outputted from the block processor 513, and in relation with the data deinterleaving process in a later process, the group formatter 514 may also insert a MPEG header place holder, a non-systematic RS parity place holder, and a main data place holder in the data group. Herein, the main data group place holder is inserted because the enhanced data and the main data may be mixed in the head and tail areas depending upon the input of the data deinterleaver. For example, based upon the output of the data after being deinterleaved, the place holder for the MPEG header may be allocated to the front of each data packet. Additionally, the group formatter 514 may either insert known data generated according to a pre-defined rule, or insert a known data place holder for inserting known data in a later process. Furthermore, a place holder for the initialization of the trellis encoder module 527 is inserted in a corresponding area. For example, the initialization data place holder may be inserted at the beginning (or front) of the data place sequence.

The output of the group formatter 514 is inputted to the data deinterleaver 515. And, the data deinterleaver 515 performs an inverse process of the data interleaver deinterleaving the data and place holder within the data group being outputted from the group formatter 514. Thereafter, the data deinterleaver 515 outputs the deinterelaved data to the packet formatter 516. Among the data deinterleaved and inputted, the packet formatter 516 removes the main data place holder and RS parity place holder that were allocated for the deinterleaving process from the inputted deinterleaved data. Thereafter, the remaining portion of the corresponding data is grouped, and 4 bytes of MPEG header are inserted therein. The 4-byte MPEG header is configured of a 1-byte MPEG synchronization byte added to the 3-byte MPEG header place holder.

When the group formatter 514 inserts the known data place holder, the packet formatter 516 may either insert actual known data in the known data place holder or output the known data place holder without any change or modification for a replacement insertion in a later process. Afterwards, the packet formatter 516 divides the data within the above-described packet-formatted data group into 188-byte unit enhanced data packets (i.e., MPEG TS packets), which are then provided to the packet multiplexer 521. The packet multiplexer 521 multiplexes the 188-byte unit enhanced data packet and main data packet outputted from the packet formatter 516 according to a pre-defined multiplexing method. Subsequently, the multiplexed data packets are outputted to the data randomizer 522. The multiplexing method may be modified or altered in accordance with diverse variables of the system design.

As an example of the multiplexing method of the packet multiplexer 521, the enhanced data burst section and the main data section may be identified along a time axis (or a chronological axis) and may be alternately repeated. At this point, the enhanced data burst section may transmit at least one data group, and the main data section may transmit only the main data. The enhanced data burst section may also transmit the main data. If the enhanced data are outputted in a burst structure, as described above, the receiving system receiving only the enhanced data may turn the power on only during the burst section so as to receive the enhanced data, and may turn the power off during the main data section in which main data are transmitted, so as to prevent the main data from being received, thereby reducing the power consumption of the receiving system.

When the data being inputted correspond to the main data packet, the data randomizer 522 performs the same randomizing process of the conventional randomizer. More specifically, the MPEG synchronization byte included in the main data packet is discarded and a pseudo random byte generated from the remaining 187 bytes is used so as to randomize the data. Thereafter, the randomized data are outputted to the RS encoder/non-systematic RS encoder 523. However, when the inputted data correspond to the enhanced data packet, the MPEG synchronization byte of the 4-byte MPEG header included in the enhanced data packet is discarded, and data randomizing is performed only on the remaining 3-byte MPEG header. Randomizing is not performed on the remaining portion of the enhanced data. Instead, the remaining portion of the enhanced data is outputted to the RS encoder/non-systematic RS encoder 523. This is because the randomizing process has already been performed on the enhanced data by the enhanced data randomizer 511 in an earlier process. Herein, a data randomizing process may or may not be performed on the known data (or known data place holder) and the initialization data place holder included in the enhanced data packet.

The RS encoder/non-systematic RS encoder 523 RS-codes the data randomized by the data randomizer 522 or the data bypassing the data randomizer 522. Then, the RS encoder/non-systematic RS encoder 523 adds a 20-byte RS parity to the coded data, thereby outputting the RS-parity-added data to the data interleaver 524. At this point, if the inputted data correspond to the main data packet, the RS encoder/non-systematic RS encoder 523 performs a systematic RS-coding process identical to that of the conventional receiving system on the inputted data, thereby adding the 20-byte RS parity at the end of the 187-byte data. Alternatively, if the inputted data correspond to the enhanced data packet, the 20 bytes of RS parity gained by performing the non-systematic RS-coding are respectively inserted in the decided parity byte places within the enhanced data packet. Herein, the data interleaver 524 corresponds to a byte unit convolutional interleaver. The output of the data interleaver 524 is inputted to the parity byte replacer 525 and the non-systematic RS encoder 526.

Meanwhile, a memory within the trellis encoding module 527, which is positioned after the parity byte replacer 525, should first be initialized in order to allow the output data of the trellis encoding module 527 so as to become the known data defined based upon an agreement between the receiving system and the transmitting system. More specifically, the memory of the trellis encoding module 527 should first be initialized before the known data sequence being inputted is trellis-encoded. At this point, the beginning of the known data sequence that is inputted corresponds to the initialization data place holder inserted by the group formatter 514 and not the actual known data. Therefore, a process of generating initialization data right before the trellis-encoding of the known data sequence being inputted and a process of replacing the initialization data place holder of the corresponding trellis encoding module memory with the newly generated initialization data are required.

A value of the trellis memory initialization data is decided based upon the memory status of the trellis encoding module 527, thereby generating the trellis memory initialization data accordingly. Due to the influence of the replace initialization data, a process of recalculating the RS parity, thereby replacing the RS parity outputted from the trellis encoding module 527 with the newly calculated RS parity is required. Accordingly, the non-systematic RS encoder 526 receives the enhanced data packet including the initialization data place holder that is to be replaced with the initialization data from the data interleaver 524 and also receives the initialization data from the trellis encoding module 527. Thereafter, among the received enhanced data packet, the initialization data place holder is replaced with the initialization data. Subsequently, the RS parity data added to the enhanced data packet are removed. Then, a new non-systematic RS parity is calculated and outputted to the parity byte replacer 525. Accordingly, the parity byte replacer 525 selects the output of the data interleaver 524 as the data within the enhanced data packet, and selects the output of the non-systematic RS encoder 526 as the RS parity. Thereafter, the parity byte replacer 525 outputs the selected data.

Meanwhile, if the main data packet is inputted, or if the enhanced data packet that does not include the initialization data place holder that is to be replaced, the parity byte replacer 525 selects the data and RS parity outputted from the data interleaver 524 and directly outputs the selected data to the trellis encoding module 527 without modification. The trellis encoding module 527 converts the byte-unit data to symbol-unit data and 12-way interleaves and trellis-encodes the converted data, which are then outputted to the frame multiplexer 528. The frame multiplexer 528 inserts field synchronization and segment synchronization signals in the output of the trellis encoding module 527 and then outputs the processed data to the transmitting unit 530. Herein, the transmitting unit 530 includes a pilot inserter 531, a modulator 532, and a radio frequency (RF) up-converter 533. The operation of the transmitting unit 530 is identical to the conventional transmitters. Therefore, a detailed description of the same will be omitted for simplicity.

Figure 9:
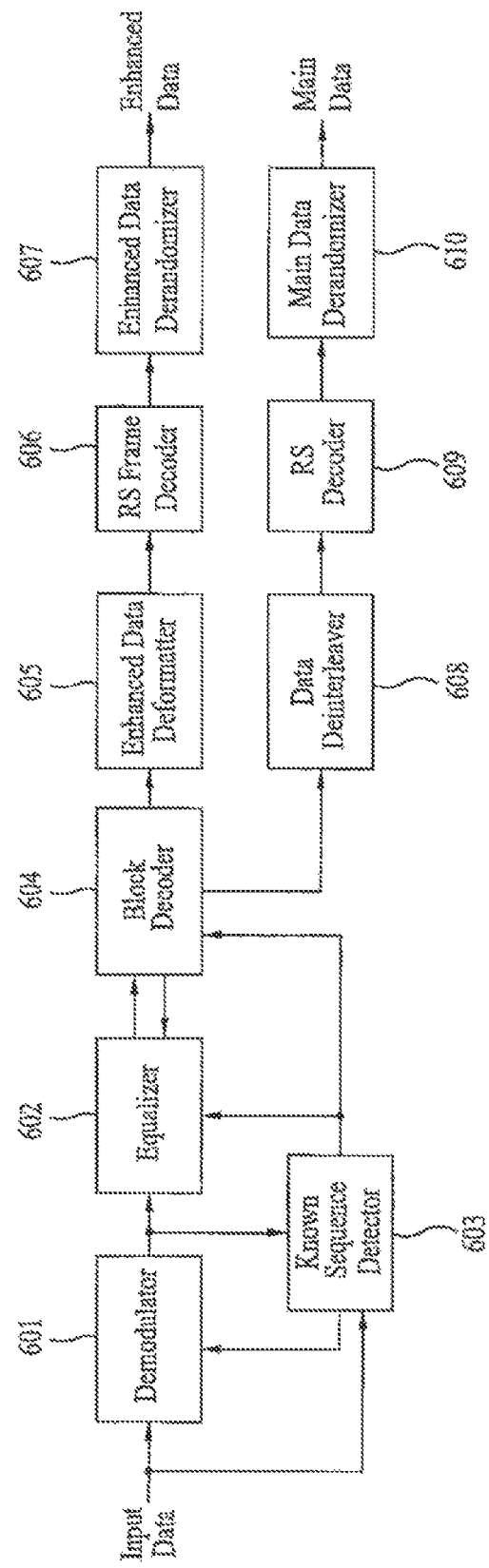
FIG. 9 illustrates a block diagram showing a general structure of a demodulating unit within a digital broadcast (or television or DTV) receiving system according to another embodiment of the present invention.

FIG. 9 illustrates a block diagram of a demodulating unit included in the receiving system according to another embodiment of the present invention. Herein, the demodulating unit may effectively process signals transmitted from the transmitting system shown in FIG. 8. Referring to FIG. 9, the demodulating unit includes a demodulator 601, a channel equalizer 602, a known sequence detector 603, a block decoder 604, an enhanced data deformatter 605, a RS frame decoder 606, an enhanced data derandomizer 607, a data deinterleaver 608, a RS decoder 609, and a main data derandomizer 910. For simplicity, the demodulator 601, the channel equalizer 602, the known sequence detector 603, the block decoder 604, the enhanced data deformatter 605, the RS frame decoder 606, and the enhanced data derandomizer 607 will be referred to as an enhanced data processor. And, the data deinterleaver 608, the RS decoder 609, and the main data derandomizer 910 will be referred to as a main data processor.

More specifically, the enhanced data including known data and the main data are received through the tuner and inputted to the demodulator 601 and the known sequence detector 603. The demodulator 601 performs automatic gain control, carrier wave recovery, and timing recovery on the data that are being inputted, thereby creating baseband data, which are then outputted to the equalizer 602 and the known sequence detector 603. The equalizer 602 compensates the distortion within the channel included in the demodulated data. Then, the equalizer 602 outputs the compensated data to the block decoder 604.

At this point, the known sequence detector 603 detects the known data place inserted by the transmitting system to the input/output data of the demodulator 601 (i.e., data prior to demodulation or data after demodulation). Then, along with the position information, the known sequence detector 603 outputs the symbol sequence of the known data generated from the corresponding position to the demodulator 601 and the equalizer 602. Additionally, the known sequence detector 603 outputs information enabling the block decoder 604 to identify the enhanced data being additionally encoded by the transmitting system and the main data that are not additionally encoded to the block decoder 604. Furthermore, although the connection is not shown in FIG. 9, the information detected by the known sequence detector 603 may be used in the overall receiving system and may also be used in the enhanced data formatter 605 and the RS frame decoder 606.

By using the known data symbol sequence when performing the timing recovery or carrier wave recovery, the demodulating performance of the demodulator 601 may be enhanced. Similarly, by using the known data, the channel equalizing performance of the channel equalizer 602 may be enhanced. Furthermore, by feeding-back the demodulation result of the block demodulator 604, the channel equalizing performance may also be enhanced. Herein, the channel equalizer 602 may perform channel equalization through various methods. In the present invention, a method of estimating a channel impulse response (CIR) for performing the channel equalization process will be given as an example of the present invention. More specifically, in the present invention, the channel impulse response (CIR) is differently estimated and applied in accordance with each hierarchical area within the data group that are transmitted from the transmitting system. Furthermore, by using the known data having the position (or place) and contents pre-known according to an agreement between the transmitting system and the receiving system, so as to estimate the CIR, the channel equalization process may be processed with more stability.

In the present invention, one data group that is inputted for channel equalization is divided into three hierarchical areas: a head area, a body area, and a tail area. Then, each of the areas is divided into lower hierarchical areas. More specifically, the head area may be divided into a far head (FH) area, a middle head (MH) area, and a near head (NH) area. And, the tail area may be divided into a far tail (FT) area and a near tail (NT) area. Furthermore, based upon a long known data sequence, the body area may be divided into 4 lower hierarchical areas: a first lower body (B1) area, a second lower body (B2) area, a third lower body (B3) area, and a fourth lower body (B4) area. In performing channel equalization on the data within the data group by using the CIR estimated from the field synchronization signal and the known data sequence, and in accordance with the characteristic of each area, either one of the estimated CIRs may be directly used without modification, or a CIR created by interpolating or extrapolating a plurality of CIRs may be used.

Meanwhile, if the data being channel equalized and then inputted to the block decoder 604 correspond to the enhanced data on which additional encoding and trellis encoding are both performed by the transmitting system, trellis-decoding and additional decoding processes are performed as inverse processes of the transmitting system. Alternatively, if the data being channel equalized and then inputted to the block decoder 604 correspond to the main data on which additional encoding is not performed and only trellis-encoding is performed by the transmitting system, only the trellis-decoding process is performed. The data group decoded by the block decoder 604 is inputted to the enhanced data deformatter 605, and the main data packet is inputted to the data deinterleaver GOB.

More specifically, if the inputted data correspond to the main data, the block decoder 604 performs Viterbi decoding on the inputted data, so as to either output a hard decision value or hard-decide a soft decision value and output the hard-decided result. On the other hand, if the inputted correspond to the enhanced data, the block decoder 604 outputs either a hard decision value or a soft decision value on the inputted enhanced data. In other words, if the data inputted to the block decoder 604 correspond to the enhanced data, the block decoder 604 performs a decoding process on the data encoded by the block processor and the trellis encoder of the transmitting system. At this point, the output of the RS frame encoder included in the pre-processor of the transmitting system becomes an external code, and the output of the block processor and the trellis encoder becomes an internal code. In order to show maximum performance of the external code when decoding such connection codes, the decoder of the internal code should output a soft decision value. Therefore, the block decoder 604 may output a hard decision value on the enhanced data. However, when required, it is more preferable that the block decoder 604 outputs a soft decision value.

The present invention may also be used for configuring a reliability map using the soft decision value. The reliability map determines and indicates whether a byte corresponding to a group of 8 bits decided by the code of the soft decision value is reliable. For example, when an absolute value of the soft decision value exceeds a pre-determined threshold value, the value of the bit corresponding to the soft decision value code is determined to be reliable. However, if the absolute value does not exceed the pre-determined threshold value, then the value of the corresponding bit is determined to be not reliable. Further, if at least one bit among the group of 8 bits, which are determined based upon the soft decision value, is determined to be not reliable, then the reliability map indicates that the entire byte is not reliable. Herein, the process of determining the reliability by 1-bit units is merely exemplary. The corresponding byte may also be indicated to be not reliable if a plurality of bits (e.g., 4 bits) is determined to be not reliable.

Conversely, when all of the bits are determined to be reliable within one byte (i.e., when the absolute value of the soft value of all bits exceeds the pre-determined threshold value), then the reliability map determines and indicates that the corresponding data byte is reliable. Similarly, when more than 4 bits are determined to be reliable within one data byte, then the reliability map determines and indicates that the corresponding data byte is reliable. The estimated numbers are merely exemplary and do not limit the scope and spirit of the present invention. Herein, the reliability map may be used when performing error correction decoding processes.

Meanwhile, the data deinterleaver 608, the RS decoder 609, and the main data derandomizer 910 are blocks required for receiving the main data. These blocks may not be required in a receiving system structure that receives only the enhanced data. The data deinterleaver 608 performs an inverse process of the data interleaver of the transmitting system. More specifically, the data deinterleaver 608 deinterleaves the main data being outputted from the block decode 604 and outputs the deinterleaved data to the RS decoder 609. The RS decoder 609 performs systematic RS decoding on the deinterleaved data and outputs the systematically decoded data to the main data derandomizer 910. The main data derandomizer 910 receives the data outputted from the RS decoder 609 so as to generate the same pseudo random byte as that of the randomizer in the transmitting system. The main data derandomizer 910 then performs a bitwise exclusive OR (XOR) operation on the generated pseudo random data byte, thereby inserting the MPEG synchronization bytes to the beginning of each packet so as to output the data in 188-byte main data packet units.

Herein, the format of the data being outputted to the enhanced data deformatter 605 from the block decoder 604 is a data group format. At this point, the enhanced data deformatter 605 already knows the structure of the input data. Therefore, the enhanced data deformatter 605 identifies the system information including signaling information and the enhanced data from the data group. Thereafter, the identified signaling information is transmitted to where the system information is required, and the enhanced data are outputted to the RS frame decoder 606. The enhanced data deformatter 605 removes the known data, trellis initialization data, and MPEG header that were included in the main data and the data group and also removes the RS parity that was added by the RS encoder/non-systematic RS encoder of the transmitting system. Thereafter, the processed data are outputted to the RS frame decoder 606.

More specifically, the RS frame decoder 606 receives the RS-coded and CRC-coded enhanced data from the enhanced data deformatter 605 so as to configure the RS frame. The RS frame decoder 606 performs an inverse process of the RS frame encoder included in the transmitting system, thereby correcting the errors within the RS frame. Then, the 1-byte MPEG synchronization byte, which was removed during the RS frame coding process, is added to the error corrected enhanced data packet. Subsequently, the processed data are outputted to the enhanced data derandomizer 607. Herein, the enhanced data derandomizer 607 performs a derandomizing process, which corresponds to an inverse process of the enhanced data randomizer included in the transmitting system, on the received enhanced data. Then, by outputting the processed data, the enhanced data transmitted from the transmitting system can be obtained.

According to an embodiment of the present invention, the RS frame decoder 606 may also be configured as follows. The RS frame decoder 606 may perform a CRC syndrome check on the RS frame, thereby verifying whether or not an error has occurred in each row. Subsequently, the CRC checksum is removed and the presence of an error is indicated on a CRC error flag corresponding to each row. Then, a RS decoding process is performed on the RS frame having the CRC checksum removed in a column direction. At this point, depending upon the number of CRC error flags, a RS erasure decoding process may be performed. More specifically, by checking the CRC error flags corresponding to each row within the RS frame, the number of CRC error flags may be determined whether it is greater or smaller than the maximum number of errors, when RS decoding the number of rows with errors (or erroneous rows) in the column direction. Herein, the maximum number of errors corresponds to the number of parity bytes inserted during the RS decoding process. As an example of the present invention, it is assumed that 48 parity bytes are added to each column.

If the number of rows with CRC errors is equal to or smaller than the maximum number of errors (e.g., 48), which may be corrected by the RS erasure decoding process, the RS erasure decoding process is performed on the RS frame in the column direction. Thereafter, the 48 bytes of parity data that were added at the end of each column are removed. However, if the number of rows with CRC errors is greater than the maximum number of errors (e.g., 48), which may be corrected by the RS erasure decoding process, the RS erasure decoding process cannot be performed. In this case, the error may be corrected by performing a general RS decoding process.

As another embodiment of the present invention, the error correction ability may be enhanced by using the reliability map created when configuring the RS frame from the soft decision value. More specifically, the RS frame decoder 606 compares the absolute value of the soft decision value obtained from the block decoder 604 to the pre-determined threshold value so as to determine the reliability of the bit values that are decided by the code of the corresponding soft decision value. Then, 8 bits are grouped to configure a byte. Then, the reliability information of the corresponding byte is indicated on the reliability map. Therefore, even if a specific row is determined to have CRC errors as a result of the CRC syndrome checking process of the corresponding row, it is not assumed that all of the data bytes included in the corresponding row have error. Instead, only the data bytes that are determined to be not reliable, after referring to the reliability information on the reliability map, are set to have errors. In other words, regardless of the presence of CRC errors in the corresponding row, only the data bytes that are determined to be not reliable (or unreliable) by the reliability map are set as erasure points.

Thereafter, if the number of erasure points for each column is equal to or smaller than the maximum number of errors (e.g., 48), the RS erasure decoding process is performed on the corresponding the column. Conversely, if the number of erasure points is greater than the maximum number of errors (e.g., 48), which may be corrected by the RS erasure decoding process, a general decoding process is performed on the corresponding column. In other words, if the number of rows having CRC errors is greater than the maximum number of errors (e.g., 48), which may be corrected by the RS erasure decoding process, either a RS erasure decoding process or a general RS decoding process is performed on a particular column in accordance with the number of erasure point within the corresponding column, wherein the number is decided based upon the reliability information on the reliability map. When the above-described process is performed, the error correction decoding process is performed in the direction of all of the columns included in the RS frame. Thereafter, the 48 bytes of parity data added to the end of each column are removed.

Figure 10:
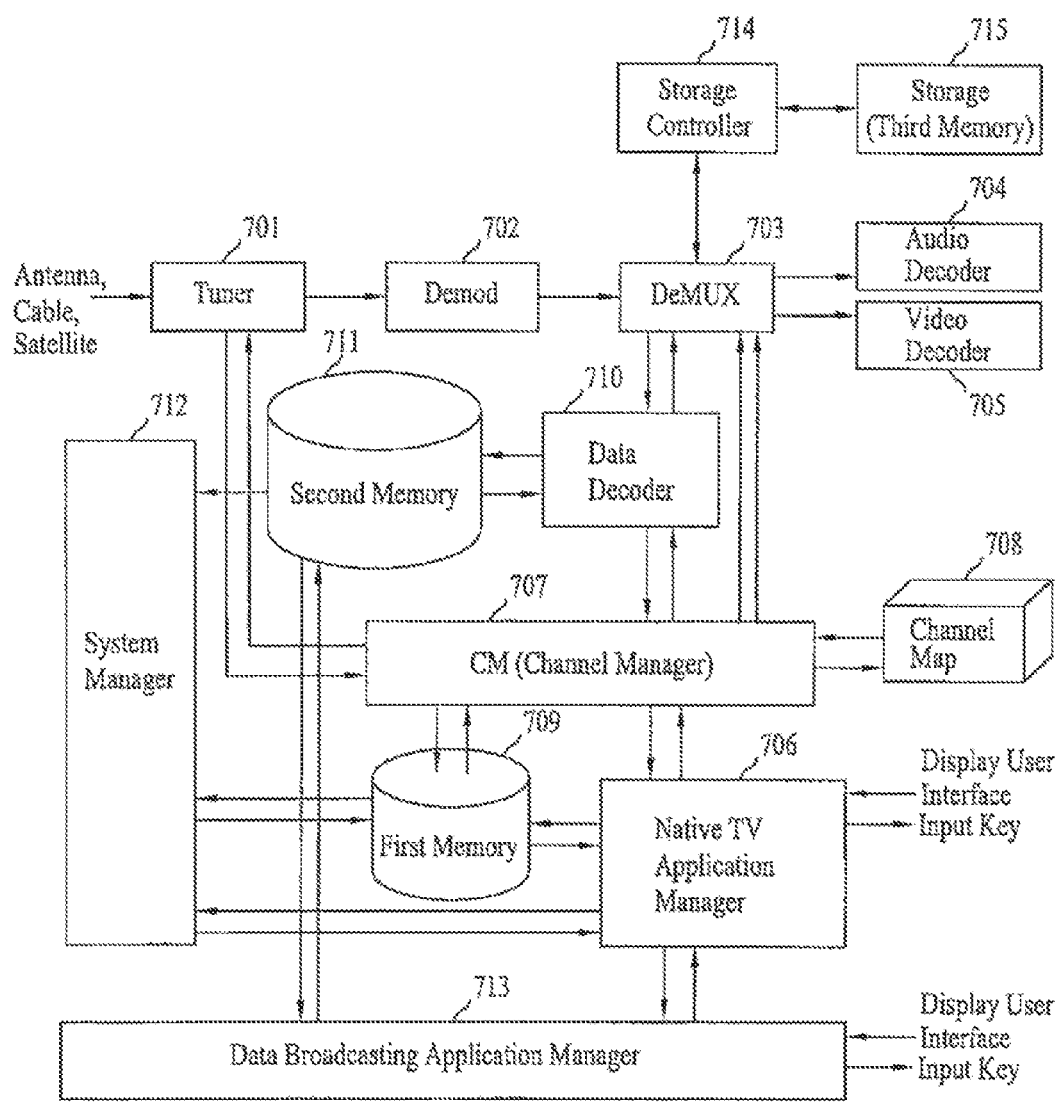
FIG. 10 illustrates a block diagram showing the structure of a digital broadcast (or television or DTV) receiving system according to an embodiment of the present invention.

FIG. 10 illustrates a block diagram showing the structure of a digital broadcast receiving system according to an embodiment of the present invention. Referring to FIG. 10, the digital broadcast receiving system includes a tuner 701, a demodulating unit 702, a demultiplexer 703, an audio decoder 704, a video decoder 705, a native TV application manager 706, a channel manager 707, a channel map 708, a first memory 709, a data decoder 710, a second memory 711, a system manager 712, a data broadcasting application manager 713, a storage controller 714, and a third memory 715. Herein, the third memory 715 is a mass storage device, such as a hard disk drive (HDD) or a memory chip. The tuner 701 tunes a frequency of a specific channel through any one of an antenna, cable, and satellite. Then, the tuner 701 down-converts the tuned frequency to an intermediate frequency (IF), which is then outputted to the demodulating unit 702. At this point, the tuner 701 is controlled by the channel manager 707. Additionally, the result and strength of the broadcast signal of the tuned channel are also reported to the channel manager 707. The data that are being received by the frequency of the tuned specific channel include main data, enhanced data, and table data for decoding the main data and enhanced data.

In the embodiment of the present invention, examples of the enhanced data may include data provided for data service, such as Java application data, HTML application data, XML data, and so on. The data provided for such data services may correspond either to a Java class file for the Java application, or to a directory file designating positions (or locations) of such files. Furthermore, such data may also correspond to an audio file and/or a video file used in each application. The data services may include weather forecast services, traffic information services, stock information services, services providing information quiz programs providing audience participation services, real time poll, user interactive education programs, gaming services, services providing information on soap opera (or TV series) synopsis, characters, original sound track, filing sites, services providing information on past sports matches, profiles and accomplishments of sports players, product information and product ordering services, services providing information on broadcast programs by media type, airing time, subject, and so on. The types of data services described above are only exemplary and are not limited only to the examples given herein. Furthermore, depending upon the embodiment of the present invention, the enhanced data may correspond to meta data. For example, the meta data use the XML application so as to be transmitted through a DSM-CC protocol.

The demodulating unit 702 performs VSB-demodulation and channel equalization on the signal being outputted from the tuner 701, thereby identifying the main data and the enhanced data. Thereafter, the identified main data and enhanced data are outputted in TS packet units. Examples of the demodulating unit 702 is shown in FIG. 7 and FIG. 9. The demodulating unit shown in FIG. 7 and FIG. 9 is merely exemplary and the scope of the present invention is not limited to the examples set forth herein. In the embodiment given as an example of the present invention, only the enhanced data packet outputted from the demodulating unit 702 is inputted to the demultiplexer 703. In this case, the main data packet is inputted to another demultiplexer (not shown) that processes main data packets. Herein, the storage controller 714 is also connected to the other demultiplexer in order to store the main data after processing the main data packets. The demultiplexer of the present invention may also be designed to process both enhanced data packets and main data packets in a single demultiplexer.

The storage controller 714 is interfaced with the demultipelxer so as to control instant recording, reserved (or preprogrammed) recording, time shift, and so on of the enhanced data and/or main data. For example, when one of instant recording, reserved (or pre-programmed) recording, and time shift is set and programmed in the receiving system (or receiver) shown in FIG. 10, the corresponding enhanced data and/or main data that are inputted to the demultiplexer are stored in the third memory 715 in accordance with the control of the storage controller 714. The third memory 715 may be described as a temporary storage area and/or a permanent storage area. Herein, the temporary storage area is used for the time shifting function, and the permanent storage area is used for a permanent storage of data according to the user's choice (or decision).

When the data stored in the third memory 715 need to be reproduced (or played), the storage controller 714 reads the corresponding data stored in the third memory 715 and outputs the read data to the corresponding demultiplexer (e.g., the enhanced data are outputted to the demultiplexer 703 shown in FIG. 10). At this point, according to the embodiment of the present invention, since the storage capacity of the third memory 715 is limited, the compression encoded enhanced data and/or main data that are being inputted are directly stored in the third memory 715 without any modification for the efficiency of the storage capacity. In this case, depending upon the reproduction (or reading) command, the data read from the third memory 715 pass trough the demultiplexer so as to be inputted to the corresponding decoder, thereby being restored to the initial state.

The storage controller 714 may control the reproduction (or play), fast-forward, rewind, slow motion, instant replay functions of the data that are already stored in the third memory 715 or presently being buffered. Herein, the instant replay function corresponds to repeatedly viewing scenes that the viewer (or user) wishes to view once again. The instant replay function may be performed on stored data and also on data that are currently being received in real time by associating the instant replay function with the time shift function. If the data being inputted correspond to the analog format, for example, if the transmission mode is NTSC, PAL, and so on, the storage controller 714 compression encodes the inputted data and stored the compression-encoded data to the third memory 715. In order to do so, the storage controller 714 may include an encoder, wherein the encoder may be embodied as one of software, middleware, and hardware. Herein, an MPEG encoder may be used as the encoder according to an embodiment of the present invention. The encoder may also be provided outside of the storage controller 714.

Meanwhile, in order to prevent illegal duplication (or copies) of the input data being stored in the third memory 715, the storage controller 714 scrambles the input data and stores the scrambled data in the third memory 715. Accordingly, the storage controller 714 may include a scramble algorithm for scrambling the data stored in the third memory 715 and a descramble algorithm for descrambling the data read from the third memory 715. Herein, the definition of scramble includes encryption, and the definition of descramble includes decryption. The scramble method may include using an arbitrary key (e.g., control word) to modify a desired set of data, and also a method of mixing signals.

Meanwhile, the demultiplexer 703 receives the real-time data outputted from the demodulating unit 702 or the data read from the third memory 715 and demultiplexes the received data. In the example given in the present invention, the demultiplexer 703 performs demultiplexing on the enhanced data packet. Therefore, in the present invention, the receiving and processing of the enhanced data will be described in detail. It should also be noted that a detailed description of the processing of the main data will be omitted for simplicity starting from the description of the demultiplexer 703 and the subsequent elements.

The demultiplexer 703 demultiplexes enhanced data and program specific information/program and system information protocol (PSI/PSIP) tables from the enhanced data packet inputted in accordance with the control of the data decoder 710. Thereafter, the demultiplexed enhanced data and PSI/PSIP tables are outputted to the data decoder 710 in a section format. In order to extract the enhanced data from the channel through which enhanced data are transmitted and to decode the extracted enhanced data, system information is required. Such system information may also be referred to as service information. The system information may include channel information, event information, etc. In the embodiment of the present invention, the PSI/PSIP tables are applied as the system information. However, the present invention is not limited to the example set forth herein. More specifically, regardless of the name, any protocol transmitting system information in a table format may be applied in the present invention.

The PSI table is an MPEG-2 system standard defined for identifying the channels and the programs. The PSIP table is an advanced television systems committee (ATSC) standard that can identify the channels and the programs. The PSI table may include a program association table (PAT), a conditional access table (CAT), a program map table (PMT), and a network information table (NIT). Herein, the PAT corresponds to special information that is transmitted by a data packet having a PID of '0'. The PAT transmits PID information of the PMT and PID information of the NIT corresponding to each program. The CAT transmits information on a paid broadcast system used by the transmitting system. The PMT transmits PID information of a transport stream (TS) packet, in which program identification numbers and individual bit sequences of video and audio data configuring the corresponding program are transmitted, and the PID information, in which PCR is transmitted. The NIT transmits information of the actual transmission network.

The PSIP table may include a virtual channel table (VCT), a system time table (STT), a rating region table (RRT), an extended text table (ETT), a direct channel change table (DCCT), an event information table (ETT), and a master guide table (MGT). The VCT transmits information on virtual channels, such as channel information for selecting channels and information such as packet identification (PID) numbers for receiving the audio and/or video data. More specifically, when the VCT is parsed, the PID of the audio/video data of the broadcast program may be known. Herein, the corresponding audio/video data are transmitted within the channel along with the channel name and the channel number. The STT transmits information on the current data and timing information. The RRT transmits information on region and consultation organs for program ratings. The ETT transmits additional description of a specific channel and broadcast program. The EIT transmits information on virtual channel events (e.g., program title, program start time, etc.). The DCCT/DCCSCT transmits information associated with automatic (or direct) channel change. And, the MGT transmits the versions and PID information of the above-mentioned tables included in the PSIP.

Each of the above-described tables included in the PSI/PSIP is configured of a basic unit referred to as a "section" and a combination of one or more sections forms a table. For example, the VCT may be divided into 256 sections. Herein, one section may include a plurality of virtual channel information. However, a single set of virtual channel information is not divided into two or more sections. At this point, the receiving system may parse and decode the data for the data service that are transmitting by using only the tables included in the PSI, or only the tables included in the PISP, or a combination of tables included in both the PSI and the PSIP. In order to parse and decode the data for the data service, at least one of the PAT and PMT included in the PSI, and the VCT included in the PSIP is required example, the PAT may include the system information for transmitting the data corresponding to the data service, and the PID of the PMT corresponding to the data service data (or program number). The PMT may include the PID of the TS packet used for transmitting the data service data. The VCT may include information on the virtual channel for transmitting the data service data, and the PID of the TS packet for transmitting the data service data.

Meanwhile, depending upon the embodiment of the present invention, a DVB-SI may be applied instead of the PSIP. The DVB-SI may include a network information table (NIT), a service description table (SDT), an event information table (EIT), and a time and data table (TDT). The DVB-SI may be used in combination with the above-described PSI. Herein, the NIT divides the services corresponding to particular network providers by specific groups. The NIT includes all tuning information that are used during the IRD set-up. The NIT may be used for informing or notifying any change in the tuning information. The SDT includes the service name and different parameters associated with each service corresponding to a particular MPEG multiplex. The EIT is used for transmitting information associated with all events occurring in the MPEG multiplex. The EIT includes information on the current transmission and also includes information selectively containing different transmission streams that may be received by the IRD. And, the TDT is used for updating the clock included in the IRD.

Furthermore, three selective SI tables (i.e., a bouquet associate table (BAT), a running status table (RST), and a stuffing table (ST)) may also be included. More specifically, the bouquet associate table (BAT) provides a service grouping method enabling the IRD to provide services to the viewers. Each specific service may belong to at least one 'bouquet' unit. A running status table (RST) section is used for promptly and instantly updating at least one event execution status. The execution status section is transmitted only once at the changing point of the event status. Other SI tables are generally transmitted several times. The stuffing table (ST) may be used for replacing or discarding a subsidiary table or the entire SI tables.

In the present invention, the enhanced data included in the payload within the TS packet consist of a digital storage media-command and control (DSM-CC) section format. However, the TS packet including the data service data may correspond either to a packetized elementary stream (PES) type or to a section type. More specifically, either the PES type data service data configure the TS packet, or the section type data service data configure the TS packet. The TS packet configured of the section type data will be given as the example of the present invention. At this point, the data service data are includes in the digital storage media-command and control (DSM-CC) section. Herein, the DSM-CC section is then configured of a 188-byte unit TS packet.

Furthermore, the packet identification of the TS packet configuring the DSM-CC section is included in a data service table (DST). When transmitting the DST, '0x95'? is assigned as the value of a stream_type field included in the service location descriptor of the PMT or the VCT. More specifically, when the PMT or VCT stream_type field value is '0x95', the receiving system may acknowledge that data broadcasting including enhanced data (i.e., the enhanced data) is being received. At this point, the enhanced data may be transmitted by a data carousel method. The data carousel method corresponds to repeatedly transmitting identical data on a regular basis.

At this point, according to the control of the data decoder 710, the demultiplexer 703 performs section filtering, thereby discarding repetitive sections and outputting only the non-repetitive sections to the data decoder 710. The demultiplexer 703 may also output only the sections configuring desired tables (e.g., VCT) to the data decoder 710 by section filtering. Herein, the VCT may include a specific descriptor for the enhanced data. However, the present invention does not exclude the possibilities of the enhanced data being included in other tables, such as the PMT. The section filtering method may include a method of verifying the PID of a table defined by the MGT, such as the VCT, prior to performing the section filtering process. Alternatively, the section filtering method may also include a method of directly performing the section filtering process without verifying the MGT, when the VCT includes a fixed PID (i.e., a base PID). At this point, the demultiplexer 703 performs the section filtering process by referring to a table_id field, a version_number field, a section_number field, etc.

As described above, the method of defining the PID of the VCT broadly includes two different methods. Herein, the PID of the VCT is a packet identifier required for identifying the VCT from other tables. The first method consists of setting the PID of the VCT so that it is dependent to the MGT. In this case, the receiving system cannot directly verify the VCT among the many PSI and/or PSIP tables. Instead, the receiving system must check the PID defined in the MGT in order to read the VCT. Herein, the MGT defines the PID, size, version number, and so on, of diverse tables. The second method consists of setting the PID of the VCT so that the PID is given a base PID value (or a fixed PID value), thereby being independent from the MGT. In this case, unlike in the first method, the VCT according to the present invention may be identified without having to verify every single PID included in the MGT. Evidently, an agreement on the base PID must be previously made between the transmitting system and the receiving system.

Meanwhile, in the embodiment of the present invention, the demultiplexer 703 may output only an application information table (AIT) to the data decoder 710 by section filtering. The AIT includes information on an application being operated in the receiving system for the data service. The AIT may also be referred to as an XAIT, and an AMT. Therefore, any table including application information may correspond to the following description. When the AIT is transmitted, a value of '0x05'? may be assigned to a stream_type field of the PMT. The AIT may include application information, such as application name, application version, application priority, application ID, application status (i.e., auto-start, user-specific settings, kill, etc.), application type (i.e., Java or HTML), position (or location) of stream including application class and data files, application platform directory, and location of application icon.

In the method for detecting application information for the data service by using the AIT, component_tag, original_network_id, transport_stream_id, and service_id fields may be used for detecting the application information. The component_tag field designates an elementary stream carrying a DSI of a corresponding object carousel. The original_network_id field indicates a DVB-SI original_network_id of the TS providing transport connection. The transport_stream_id field indicates the MPEG TS of the TS providing transport connection, and the service_id field indicates the DVB-SI of the service providing transport connection. Information on a specific channel may be obtained by using the original_network_id field, the transport_stream_id field, and the service_id field. The data service data, such as the application data, detected by using the above-described method may be stored in the second memory 711 by the data decoder 710.

The data decoder 710 parses the DSM-CC section configuring the demultiplexed enhanced data. Then, the enhanced data corresponding to the parsed result are stored as a database in the second memory 711. The data decoder 710 groups a plurality of sections having the same table identification (table_id) so as to configure a table, which is then parsed. Thereafter, the parsed result is stored as a database in the second memory 711. At this point, by parsing data and/or sections, the data decoder 710 reads all of the remaining actual section data that are not section-filtered by the demultiplexer 703. Then, the data decoder 710 stores the read data to the second memory 711. The second memory 711 corresponds to a table and data carousel database storing system information parsed from tables and enhanced data parsed from the DSM-CC section. Herein, a table_id field, a section_number field, and a last_section_number field included in the table may be used to indicate whether the corresponding table is configured of a single section or a plurality of sections. For example, TS packets having the PID of the VCT are grouped to form a section, and sections having table identifiers allocated to the VCT are grouped to form the VCT.

When the VCT is parsed, information on the virtual channel to which enhanced data are transmitted may be obtained. The obtained application identification information, service component identification information, and service information corresponding to the data service may either be stored in the second memory 711 or be outputted to the data broadcasting application manager 713. In addition, reference may be made to the application identification information, service component identification information, and service information in order to decode the data service data. Alternatively, such information may also prepare the operation of the application program for the data service. Furthermore, the data decoder 710 controls the demultiplexing of the system information table, which corresponds to the information table associated with the channel and events. Thereafter, an A.V PID list may be transmitted to the channel manager 707.

The channel manager 707 may refer to the channel map 708 in order to transmit a request for receiving system-related information data to the data decoder 710, thereby receiving the corresponding result. In addition, the channel manager 707 may also control the channel tuning of the tuner 701. Furthermore, the channel manager 707 may directly control the demultiplexer 703, so as to set up the A/V PID, thereby controlling the audio decoder 704 and the video decoder 705. The audio decoder 704 and the video decoder 705 may respectively decode and output the audio data and video data demultiplexed from the main data packet. Alternatively, the audio decoder 704 and the video decoder 705 may respectively decode and output the audio data and video data demultiplexed from the enhanced data packet. Meanwhile, when the enhanced data include data service data, and also audio data and video data, it is apparent that the audio data and video data demultiplexed by the demultiplexer 703 are respectively decoded by the audio decoder 704 and the video decoder 705. For example, an audio-coding (AC)-3 decoding algorithm may be applied to the audio decoder 704, and a MPEG-2 decoding algorithm may be applied to the video decoder 705.

Meanwhile, the native TV application manager 706 operates a native application program stored in the first memory 709, thereby performing general functions such as channel change. The native application program refers to software stored in the receiving system upon shipping of the product. More specifically, when a user request (or command) is transmitted to the receiving system through a user interface (UI), the native TV application manger 706 displays the user request on a screen through a graphic user interface (GUI), thereby responding to the user's request. The user interface receives the user request through an input device, such as a remote controller, a key pad, a jog controller, an a touchscreen provided on the screen, and then outputs the received user request to the native TV application manager 706 and the data broadcasting application manager 713. Furthermore, the native TV application manager 706 controls the channel manager 707, thereby controlling channel-associated, such as the management of the channel map 708, and controlling the data decoder 710. The native TV application manager 706 also controls the GUI of the overall receiving system, thereby storing the user request and status of the receiving system in the first memory 709 and restoring the stored information.

The channel manager 707 controls the tuner 701 and the data decoder 710, so as to managing the channel map 708 so that it can respond to the channel request made by the user. More specifically, channel manager 707 sends a request to the data decoder 710 so that the tables associated with the channels that are to be tuned are parsed. The results of the parsed tables are reported to the channel manager 707 by the data decoder 710. Thereafter, based on the parsed results, the channel manager 707 updates the channel map 708 and sets up a PID in the demultiplexer 703 for demultiplexing the tables associated with the data service data from the enhanced data.

The system manager 712 controls the booting of the receiving system by turning the power on or off. Then, the system manager 712 stores ROM images (including downloaded software images) in the first memory 709. More specifically, the first memory 709 stores management programs such as operating system (OS) programs required for managing the receiving system and also application program executing data service functions. The application program is a program processing the data service data stored in the second memory 711 so as to provide the user with the data service. If the data service data are stored in the second memory 711 the corresponding data service data are processed by the above-described application program or by other application programs, thereby being provided to the user. The management program and application program stored in the first memory 709 may be updated or corrected to a newly downloaded program. Furthermore, the storage of the stored management program and application program is maintained without being deleted even if the power of the system is shut down. Therefore, when the power is supplied the programs may be executed without having to be newly downloaded once again.

The application program for providing data service according to the present invention may either be initially stored in the first memory 709 upon the shipping of the receiving system, or be stored in the first 709 after being downloaded. The application program for the data service (i.e., the data service providing application program) stored in the first memory 709 may also be deleted, updated, and corrected. Furthermore, the data service providing application program may be downloaded and executed along with the data service data each time the data service data are being received.

When a data service request is transmitted through the user interface, the data broadcasting application manager 713 operates the corresponding application program stored in the first memory 709 so as to process the requested data, thereby providing the user with the requested data service. And, in order to provide such data service, the data broadcasting application manager 713 supports the graphic user interface (GUI). Herein, the data service may be provided in the form of text (or short message service (SMS)), voice message, still image, and moving image. The data broadcasting application manager 713 may be provided with a platform for executing the application program stored in the first memory 709. The platform may be, for example, a Java virtual machine for executing the Java program. Hereinafter, an example of the data broadcasting application manager 713 executing the data service providing application program stored in the first memory 709, so as to process the data service data stored in the second memory 711, thereby providing the user with the corresponding data service will now be described in detail.

Assuming that the data service corresponds to a traffic information service, the data service according to the present invention is provided to the user of a receiving system that is not equipped with an electronic map and/or a GPS system in the form of at least one of a text (or short message service (SMS)), a voice message, a graphic message, a still image, and a moving image. In this case, is a GPS module is mounted on the receiving system shown in FIG. 10, the GPS module receives satellite signals transmitted from a plurality of low earth orbit satellites and extracts the current position (or location) information (e.g., longitude, latitude, altitude), thereby outputting the extracted information to the data broadcasting application manager 713.

At this point, it is assumed that the electronic map including information on each link and nod and other diverse graphic information are stored in one of the second memory 711, the first memory 709, and another memory that is not shown. More specifically, according to the request made by the data broadcasting application manager 713, the data service data stored in the second memory 711 are read and inputted to the data broadcasting application manager 713. The data broadcasting application manager 713 translates (or deciphers) the data service data read from the second memory 711, thereby extracting the necessary information according to the contents of the message and/or a control signal.

Figure 11:
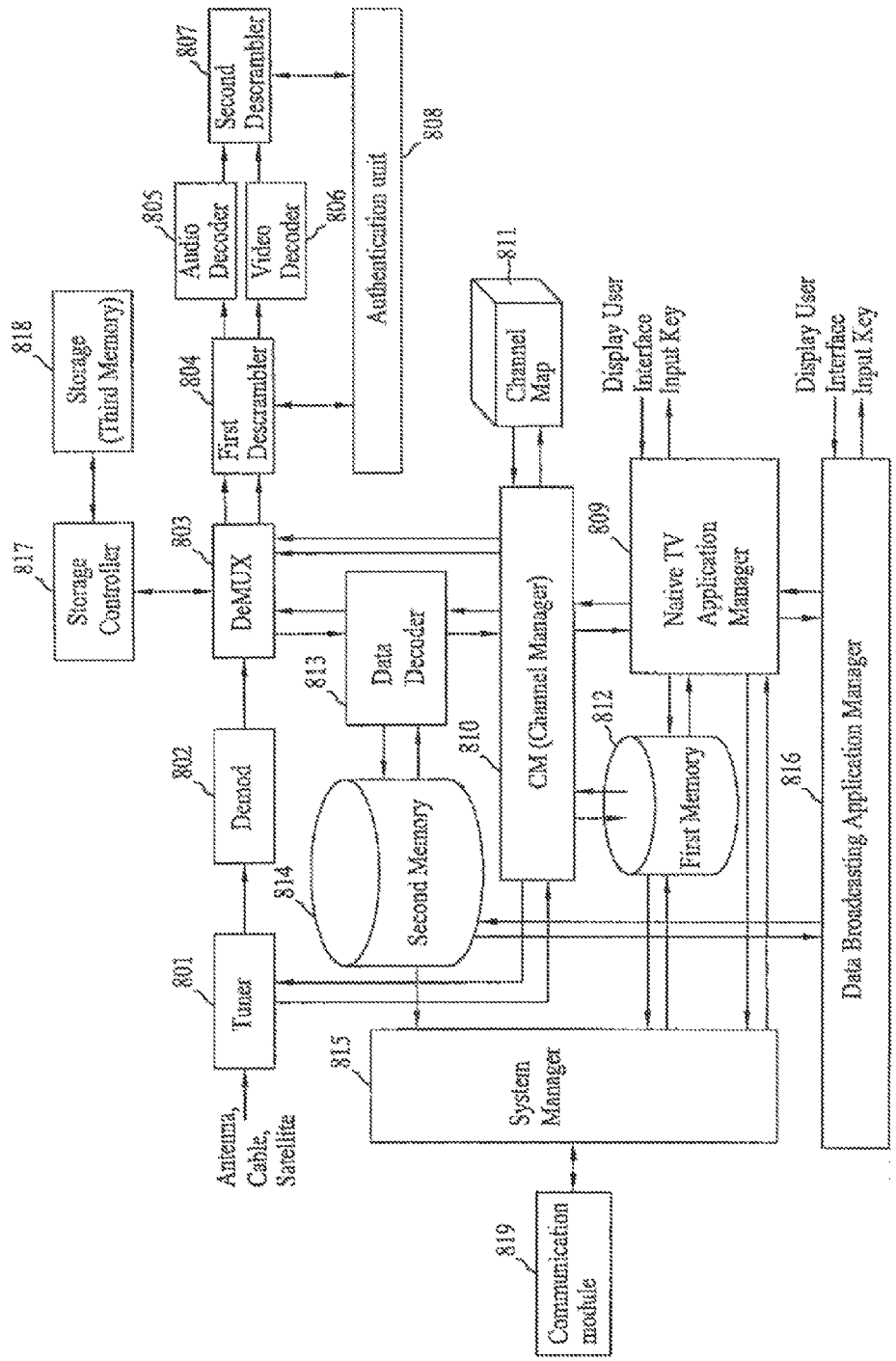
FIG. 11 illustrates a block diagram showing the structure of a digital broadcast (or television or DTV) receiving system according to another embodiment of the present invention.

FIG. 11 illustrates a block diagram showing the structure of a digital broadcast (or television) receiving system according to another embodiment of the present invention. Referring to FIG. 11, the digital broadcast receiving system includes a tuner 801, a demodulating unit 802, a demultiplexer 803, a first descrambler 804, an audio decoder 805, a video decoder 806, a second descrambler 807, an authentication unit 808, a native TV application manager 809, a channel manager 810, a channel map 811, a first memory 812, a data decoder 813, a second memory 814, a system manager 815, a data broadcasting application manager 816, a storage controller 817, a third memory 818, and a telecommunication module 819. Herein, the third memory 818 is a mass storage device, such as a hard disk drive (HDD) or a memory chip. Also, during the description of the digital broadcast (or television or DTV) receiving system shown in FIG. 11, the components that are identical to those of the digital broadcast receiving system of FIG. 10 will be omitted for simplicity.

As described above, in order to provide services for preventing illegal duplication (or copies) or illegal viewing of the enhanced data and/or main data that are transmitted by using a broadcast network, and to provide paid broadcast services, the transmitting system may generally scramble and transmit the broadcast contents. Therefore, the receiving system needs to descramble the scrambled broadcast contents in order to provide the user with the proper broadcast contents. Furthermore, the receiving system may generally be processed with an authentication process with an authentication means before the descrambling process. Hereinafter, the receiving system including an authentication means and a descrambling means according to an embodiment of the present invention will now be described in detail.

According to the present invention, the receiving system may be provided with a descrambling means receiving scrambled broadcasting contents and an authentication means authenticating (or verifying) whether the receiving system is entitled to receive the descrambled contents. Hereinafter, the descrambling means will be referred to as first and second descramblers 804 and 807, and the authentication means will be referred to as an authentication unit 808. Such naming of the corresponding components is merely exemplary and is not limited to the terms suggested in the description of the present invention. For example, the units may also be referred to as a decryptor. Although FIG. 11 illustrates an example of the descramblers 804 and 807 and the authentication unit 808 being provided inside the receiving system, each of the descramblers 804 and 807 and the authentication unit 808 may also be separately provided in an internal or external module. Herein, the module may include a slot type, such as a SD or CF memory, a memory stick type, a USB type, and so on, and may be detachably fixed to the receiving system.

As described above, when the authentication process is performed successfully by the authentication unit 808, the scrambled broadcasting contents are descrambled by the descramblers 804 and 807, thereby being provided to the user. At this point, a variety of the authentication method and descrambling method may be used herein. However, an agreement on each corresponding method should be made between the receiving system and the transmitting system. Hereinafter, the authentication and descrambling methods will now be described, and the description of identical components or process steps will be omitted for simplicity.

The receiving system including the authentication unit 808 and the descramblers 804 and 807 will now be described in detail. The receiving system receives the scrambled broadcasting contents through the tuner 801 and the demodulating unit 802. Then, the system manager 815 decides whether the received broadcasting contents have been scrambled. Herein, the demodulating unit 802 may be included as a demodulating means according to embodiments of the present invention as described in FIG. 7 and FIG. 9. However, the present invention is not limited to the examples given in the description set forth herein. If the system manager 815 decides that the received broadcasting contents have been scrambled, then the system manager 815 controls the system to operate the authentication unit 808. As described above, the authentication unit 808 performs an authentication process in order to decide whether the receiving system according to the present invention corresponds to a legitimate host entitled to receive the paid broadcasting service. Herein, the authentication process may vary in accordance with the authentication methods.

For example, the authentication unit 808 may perform the authentication process by comparing an IP address of an IP datagram within the received broadcasting contents with a specific address of a corresponding host. At this point, the specific address of the corresponding receiving system (or host) may be a MAC address. More specifically, the authentication unit 808 may extract the IP address from the decapsulated IP datagram, thereby obtaining the receiving system information that is mapped with the IP address. At this point, the receiving system should be provided, in advance, with information (e.g., a table format) that can map the IP address and the receiving system information. Accordingly, the authentication unit 808 performs the authentication process by determining the conformity between the address of the corresponding receiving system and the system information of the receiving system that is mapped with the IP address. In other words, if the authentication unit 808 determines that the two types of information conform to one another, then the authentication unit 808 determines that the receiving system is entitled to receive the corresponding broadcasting contents.

In another example, standardized identification information is defined in advance by the receiving system and the transmitting system. Then, the identification information of the receiving system requesting the paid broadcasting service is transmitted by the transmitting system. Thereafter, the receiving system determines whether the received identification information conforms with its own unique identification number, so as to perform the authentication process. More specifically, the transmitting system creates a database for storing the identification information (or number) of the receiving system requesting the paid broadcasting service. Then, if the corresponding broadcasting contents are scrambled, the transmitting system includes the identification information in the EMM, which is then transmitted to the receiving system.

If the corresponding broadcasting contents are scrambled, messages (e.g., entitlement control message (ECM), entitlement management message (EMM)), such as the CAS information, mode information, message position information, that are applied to the scrambling of the broadcasting contents are transmitted through a corresponding data header or another data packet. The ECM may include a control word (CW) used for scrambling the broadcasting contents. At this point, the control word may be encoded with an authentication key. The EMM may include an authentication key and entitlement information of the corresponding data. Herein, the authentication key may be encoded with a receiving system-specific distribution key. In other words, assuming that the enhanced data are scrambled by using the control word, and that the authentication information and the descrambling information are transmitted from the transmitting system, the transmitting system encodes the CW with the authentication key and, then, includes the encoded CW in the entitlement control message (ECM), which is then transmitted to the receiving system. Furthermore, the transmitting system includes the authentication key used for encoding the CW and the entitlement to receive data (or services) of the receiving system (i.e., a standardized serial number of the receiving system that is entitled to receive the corresponding broadcasting service or data) in the entitlement management message (EMM), which is then transmitted to the receiving system.

Accordingly, the authentication unit 808 of the receiving system extracts the identification information of the receiving system and the identification information included in the EMM of the broadcasting service that is being received. Then, the authentication unit 808 determines whether the identification information conform to each other, so as to perform the authentication process. More specifically, if the authentication unit 808 determines that the information conform to each other, then the authentication unit 808 eventually determines that the receiving system is entitled to receive the request broadcasting service.

In yet another example, the authentication unit 808 of the receiving system may be detachably fixed to an external module. In this case, the receiving system is interfaced with the external module through a common interface (CI). In other words, the external module may receive the data scrambled by the receiving system through the common interface, thereby performing the descrambling process of the received data. Alternatively, the external module may also transmit only the information required for the descrambling process to the receiving system. The common interface is configured on a physical layer and at least one protocol layer. Herein, in consideration of any possible expansion of the protocol layer in a later process, the corresponding protocol layer may be configured to have at least one layer that can each provide an independent function.

The external module may either consist of a memory or card having information on the key used for the scrambling process and other authentication information but not including any descrambling function, or consist of a card having the above-mentioned key information and authentication information and including the descrambling function. Both the receiving system and the external module should be authenticated in order to provide the user with the paid broadcasting service provided (or transmitted) from the transmitting system. Therefore, the transmitting system can only provide the corresponding paid broadcasting service to the authenticated pair of receiving system and external module.

Additionally, an authentication process should also be performed between the receiving system and the external module through the common interface. More specifically, the module may communicate with the system manager 815 included in the receiving system through the common interface, thereby authenticating the receiving system. Alternatively, the receiving system may authenticate the module through the common interface. Furthermore, during the authentication process, the module may extract the unique ID of the receiving system and its own unique ID and transmit the extracted IDs to the transmitting system. Thus, the transmitting system may use the transmitted ID values as information determining whether to start the requested service or as payment information. Whenever necessary, the system manager 815 transmits the payment information to the remote transmitting system through the telecommunication module 819.

The authentication unit 808 authenticates the corresponding receiving system and/or the external module. Then, if the authentication process is successfully completed, the authentication unit 808 certifies the corresponding receiving system and/or the external module as a legitimate system and/or module entitled to receive the requested paid broadcasting service. In addition, the authentication unit 808 may also receive authentication-associated information from a mobile telecommunications service provider to which the user of the receiving system is subscribed, instead of the transmitting system providing the requested broadcasting service. In this case, the authentication-association information may either be scrambled by the transmitting system providing the broadcasting service and, then, transmitted to the user through the mobile telecommunications service provider, or be directly scrambled and transmitted by the mobile telecommunications service provider. Once the authentication process is successfully completed by the authentication unit 808, the receiving system may descramble the scrambled broadcasting contents received from the transmitting system. At this point, the descrambling process is performed by the first and second descramblers 804 and 807. Herein, the first and second descramblers 804 and 807 may be included in an internal module or an external module of the receiving system.

The receiving system is also provided with a common interface for communicating with the external module including the first and second descramblers 804 and 807, so as to perform the descrambling process. More specifically, the first and second descramblers 804 and 807 may be included in the module or in the receiving system in the form of hardware, middleware or software. Herein, the descramblers 804 and 807 may be included in any one of or both of the module and the receiving system. If the first and second descramblers 804 and 807 are provided inside the receiving system, it is advantageous to have the transmitting system (i.e., at least any one of a service provider and a broadcast station) scramble the corresponding data using the same scrambling method.

Alternatively, if the first and second descramblers 804 and 807 are provided in the external module, it is advantageous to have each transmitting system scramble the corresponding data using different scrambling methods. In this case, the receiving system is not required to be provided with the descrambling algorithm corresponding to each transmitting system. Therefore, the structure and size of receiving system may be simplified and more compact. Accordingly, in this case, the external module itself may be able to provide CA functions, which are uniquely and only provided by each transmitting systems, and functions related to each service that is to be provided to the user. The common interface enables the various external modules and the system manager 815, which is included in the receiving system, to communicate with one another by a single communication method. Furthermore, since the receiving system may be operated by being connected with at least one or more modules providing different services, the receiving system may be connected to a plurality of modules and controllers.

In order to maintain successful communication between the receiving system and the external module, the common interface protocol includes a function of periodically checking the status of the opposite correspondent. By using this function, the receiving system and the external module is capable of managing the status of each opposite correspondent. This function also reports the user or the transmitting system of any malfunction that may occur in any one of the receiving system and the external module and attempts the recovery of the malfunction.

In yet another example, the authentication process may be performed through software. More specifically, when a memory card having CAS software downloaded, for example, and stored therein in advanced is inserted in the receiving system, the receiving system receives and loads the CAS software from the memory card so as to perform the authentication process. In this example, the CAS software is read out from the memory card and stored in the first memory 812 of the receiving system. Thereafter, the CAS software is operated in the receiving system as an application program. According to an embodiment of the present invention, the CAS software is mounted on (or stored) in a middleware platform and, then executed. A Java middleware will be given as an example of the middleware included in the present invention. Herein, the CAS software should at least include information required for the authentication process and also information required for the descrambling process.

Therefore, the authentication unit 808 performs authentication processes between the transmitting system and the receiving system and also between the receiving system and the memory card. At this point, as described above, the memory card should be entitled to receive the corresponding data and should include information on a normal receiving system that can be authenticated. For example, information on the receiving system may include a unique number, such as a standardized serial number of the corresponding receiving system. Accordingly, the authentication unit 808 compares the standardized serial number included in the memory card with the unique information of the receiving system, thereby performing the authentication process between the receiving system and the memory card.

If the CAS software is first executed in the Java middleware base, then the authentication between the receiving system and the memory card is performed. For example, when the unique number of the receiving system stored in the memory card conforms to the unique number of the receiving system read from the system manager 815, then the memory card is verified and determined to be a normal memory card that may be used in the receiving system. At this point, the CAS software may either be installed in the first memory 812 upon the shipping of the present invention, or be downloaded to the first memory 812 from the transmitting system or the module or memory card, as described above. Herein, the descrambling function may be operated by the data broadcasting application manger 816 as an application program.

Thereafter, the CAS software parses the EMM/ECM packets outputted from the demultiplexer 803, so as to verify whether the receiving system is entitled to receive the corresponding data, thereby obtaining the information required for descrambling (i.e., the CW) and providing the obtained CW to the descramblers 804 and 807. More specifically, the CAS software operating in the Java middleware platform first reads out the unique (or serial) number of the receiving system from the corresponding receiving system and compares it with the unique number of the receiving system transmitted through the EMM, thereby verifying whether the receiving system is entitled to receive the corresponding data. Once the receiving entitlement of the receiving system is verified, the corresponding broadcasting service information transmitted to the ECM and the entitlement of receiving the corresponding broadcasting service are used to verify whether the receiving system is entitled to receive the corresponding broadcasting service. Once the receiving system is verified to be entitled to receive the corresponding broadcasting service, the authentication key transmitted to the EMM is used to decode (or decipher) the encoded CW, which is transmitted to the ECM, thereby transmitting the decoded CW to the descramblers 804 and 807. Each of the descramblers 804 and 807 uses the CW to descramble the broadcasting service.

Meanwhile, the CAS software stored in the memory card may be expanded in accordance with the paid service which the broadcast station is to provide. Additionally, the CAS software may also include other additional information other than the information associated with the authentication and descrambling. Furthermore, the receiving system may download the CAS software from the transmitting system so as to upgrade (or update) the CAS software originally stored in the memory card. As described above, regardless of the type of broadcast receiving system, as long as an external memory interface is provided, the present invention may embody a CAS system that can meet the requirements of all types of memory card that may be detachably fixed to the receiving system. Thus, the present invention may realize maximum performance of the receiving system with minimum fabrication cost, wherein the receiving system may receive paid broadcasting contents such as broadcast programs, thereby acknowledging and regarding the variety of the receiving system. Moreover, since only the minimum application program interface is required to be embodied in the embodiment of the present invention, the fabrication cost may be minimized, thereby eliminating the manufacturer's dependence on CAS manufacturers. Accordingly, fabrication costs of CAS equipments and management systems may also be minimized.

Meanwhile, the descramblers 804 and 807 may be included in the module either in the form of hardware or in the form of software. In this case, the scrambled data that being received are descrambled by the module and then demodulated. Also, if the scrambled data that are being received are stored in the third memory 818, the received data may be descrambled and then stored, or stored in the memory at the point of being received and then descrambled later on prior to being played (or reproduced). Thereafter, in case scramble/descramble algorithms are provided in the storage controller 817, the storage controller 817 scrambles the data that are being received once again and then stores the re-scrambled data to the third memory 818.

In yet another example, the descrambled broadcasting contents (transmission of which being restricted) are transmitted through the broadcasting network. Also, information associated with the authentication and descrambling of data in order to disable the receiving restrictions of the corresponding data are transmitted and/or received through the telecommunications module 819. Thus, the receiving system is able to perform reciprocal (or two-way) communication. The receiving system may either transmit data to the telecommunication module within the transmitting system or be provided with the data from the telecommunication module within the transmitting system. Herein, the data correspond to broadcasting data that are desired to be transmitted to or from the transmitting system, and also unique information (i.e., identification information) such as a serial number of the receiving system or MAC address.

The telecommunication module 819 included in the receiving system provides a protocol required for performing reciprocal (or two-way) communication between the receiving system, which does not support the reciprocal communication function, and the telecommunication module included in the transmitting system. Furthermore, the receiving system configures a protocol data unit (PDU) using a tag-length-value (TLV) coding method including the data that are to be transmitted and the unique information (or ID information). Herein, the tag field includes indexing of the corresponding PDU. The length field includes the length of the value field. And, the value field includes the actual data that are to be transmitted and the unique number (e.g., identification number) of the receiving system.

The receiving system may configure a platform that is equipped with the Java platform and that is operated after downloading the Java application of the transmitting system to the receiving system through the network. In this case, a structure of downloading the PDU including the tag field arbitrarily defined by the transmitting system from a storage means included in the receiving system and then transmitting the downloaded PDU to the telecommunication module 819 may also be configured. Also, the PDU may be configured in the Java application of the receiving system and then outputted to the telecommunication module 819. The PDU may also be configured by transmitting the tag value, the actual data that are to be transmitted, the unique information of the corresponding receiving system from the Java application and by performing the TLV coding process in the receiving system. This structure is advantageous in that the firmware of the receiving system is not required to be changed even if the data (or application) desired by the transmitting system is added.

The telecommunication module within the transmitting system either transmits the PDU received from the receiving system through a wireless data network or configures the data received through the network into a PDU which is transmitted to the host. At this point, when configuring the PDU that is to be transmitted to the host, the telecommunication module within the transmitting end may include unique information (e.g., IP address) of the transmitting system which is located in a remote location. Additionally, in receiving and transmitting data through the wireless data network, the receiving system may be provided with a common interface, and also provided with a WAP, CDMA 1x EV-DO, which can be connected through a mobile telecommunication base station, such as CDMA and GSM, and also provided with a wireless LAN, mobile internet, WiBro, WiMax, which can be connected through an access point. The above-described receiving system corresponds to the system that is not equipped with a telecommunication function. However, a receiving system equipped with telecommunication function does not require the telecommunication module 819.

The broadcasting data being transmitted and received through the above-described wireless data network may include data required for performing the function of limiting data reception. Meanwhile, the demultiplexer 803 receives either the real-time data outputted from the demodulating unit 802 or the data read from the third memory 818, thereby performing demultiplexing. In this embodiment of the present invention, the demultiplexer 803 performs demultiplexing on the enhanced data packet. Similar process steps have already been described earlier in the description of the present invention. Therefore, a detailed of the process of demultiplexing the enhanced data will be omitted for simplicity.

The first descrambler 804 receives the demultiplexed signals from the demultiplexer 803 and then descrambles the received signals. At this point, the first descrambler 804 may receive the authentication result received from the authentication unit 808 and other data required for the descrambling process, so as to perform the descrambling process. The audio decoder 805 and the video decoder 806 receive the signals descrambled by the first descrambler 804, which are then decoded and outputted. Alternatively, if the first descrambler 804 did not perform the descrambling process, then the audio decoder 805 and the video decoder 806 directly decode and output the received signals. In this case, the decoded signals are received and then descrambled by the second descrambler 807 and processed accordingly.

As described above, the DTV transmitting system and receiving system and method of processing broadcast signal according to the present invention has the following advantages. More specifically, the DTV transmitting system and receiving system and method of processing broadcast signal according to the present invention is highly protected against (or resistant to) any error that may occur when transmitting supplemental data through a channel. And, the present invention is also highly compatible to the conventional VBS receiving system. Moreover, the present invention may also receive the supplemental data without any error even in channels having severe ghost effect and noise.

Additionally, when grouping a plurality of enhanced data packets, each having information included therein, and multiplexing the enhanced data group with the main data and transmitting the multiplexed data, the data group is divided into a plurality of hierarchical areas (or layers). The data types are identified according to the characteristics of each hierarchical area, and the method of processing the corresponding data are performed in accordance with the identified areas. Thus, the receiving performance of the receiving system may be enhanced. Particularly, by adopting the pre-processing step differently according to the data type being inserted to each hierarchical area within the data group and also according to the enhanced data type that are being inputted, the receiving performance of the receiving system may also be enhanced. Furthermore, the present invention is even more effective when applied to mobile and portable receivers, which are also liable to a frequent change in channel and which require protection (or resistance) against intense noise.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A digital television (DTV) receiving system for processing digital broadcast data, the DTV receiving system comprising:
 a tuner for receiving a broadcast signal, wherein the broadcast signal is generated in a DTV transmitting system by:
  randomizing enhanced data,
  Reed Solomon (RS)-cyclic redundancy check (CRC) encoding the randomized enhanced data,
  encoding the RS-CRC encoded enhanced data at a coding rate of 1/L, wherein L is greater than 1,

RS-encoding the enhanced data encoded at the coding rate of 1/L, interleaving the RS-encoded enhanced data, thereby outputting a data group comprising a plurality of segments, wherein an ith segment in the data group comprises X bytes of enhanced data, wherein a jth segment in the data group comprises Y bytes of enhanced data, wherein a kth segment in the data group comprises Z bytes of enhanced data, and wherein $k>j>i$, $X<Y$, and $Z<Y$, and the variables i, X, Y, Z are integers greater than 0, trellis-encoding data in the data group, wherein at least one memory included in the trellis encoder is initialized at each start of known data sequences included in the data group, and modulating a broadcast signal including the trellis-encoded data; and a decoder for decoding the received broadcast signal.

2. The DTV receiving system of claim 1, further comprising:

a known data detector for detecting the known data sequences from the received broadcast signal; and an equalizer for compensating a channel distortion of the received broadcast signal based on at least one of the detected known data sequences.

3. The DTV receiving system of claim 1, wherein the received broadcast signal further includes segment synchronization data and field synchronization data.

4. A method of processing digital broadcast data in a digital television (DTV) receiving system, the method comprising:

receiving, by a tuner, a broadcast signal that is generated in a DTV transmitting system by:

randomizing enhanced data,

Reed Solomon (RS)-cyclic redundancy check (CRC) encoding the randomized enhanced data, encoding the RS-CRC encoded enhanced data at a coding rate of 1/L, wherein L is greater than 1, RS-encoding the enhanced data encoded at the coding rate of 1/L, interleaving the RS-encoded enhanced data, thereby outputting a data group comprising a plurality of segments, wherein an ith segment in the data group comprises X bytes of enhanced data, wherein a jth segment in the data group comprises Y bytes of enhanced data, wherein a kth segment in the data group comprises Z bytes of enhanced data, and wherein $k>j>i$, $X<Y$, and $Z<Y$, and the variables i, X, Y, Z are integers greater than 0, trellis-encoding data in the data group, wherein at least one memory included in the trellis encoder is initialized at each start of known data sequences included in the data group, and modulating the broadcast signal including the trellis-encoded data; and decoding, by a decoder, the received broadcast signal.

5. The method of claim 4, further comprising:

detecting the known data sequences from the received broadcast signal; and compensating a channel distortion of the received broadcast signal based on at least one of the detected known data sequences.

6. The method of claim 4, wherein the received broadcast signal further includes segment synchronization data and field synchronization data.

* * * * *